US010656526B2

(12) United States Patent
Sano et al.

(10) Patent No.: US 10,656,526 B2
(45) Date of Patent: May 19, 2020

(54) SUBSTRATE TREATMENT METHOD AND THERMAL TREATMENT APPARATUS

(71) Applicant: Tokyo Electron Limited, Tokyo (JP)

(72) Inventors: Yohei Sano, Koshi (JP); Shinichiro Kawakami, Koshi (JP); Masashi Enomoto, Koshi (JP); Takahiro Shiozawa, Koshi (JP); Keisuke Yoshida, Koshi (JP); Tomoya Onitsuka, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 36 days.

(21) Appl. No.: 15/823,661

(22) Filed: Nov. 28, 2017

(65) Prior Publication Data

US 2018/0164689 A1 Jun. 14, 2018

(30) Foreign Application Priority Data

Dec. 8, 2016 (JP) .................................. 2016-238138

(51) Int. Cl.
H01L 21/324 (2006.01)
G03F 7/38 (2006.01)
H01L 21/027 (2006.01)
G03F 7/004 (2006.01)
H01L 21/67 (2006.01)
H01L 21/3105 (2006.01)

(52) U.S. Cl.
CPC .............. *G03F 7/38* (2013.01); *G03F 7/0043* (2013.01); *H01L 21/0273* (2013.01); *H01L 21/0274* (2013.01); *H01L 21/31058* (2013.01); *H01L 21/67017* (2013.01); *H01L 21/6719* (2013.01); *H01L 21/67103* (2013.01)

(58) Field of Classification Search
CPC ............. H01L 21/02312; H01L 21/324; H01L 21/67051; G03F 7/20
See application file for complete search history.

(56) References Cited

U.S. PATENT DOCUMENTS

| 8,404,603 | B2 * | 3/2013 | Ogawa | .................. C23C 16/303 |
| | | | | 438/785 |
| 9,540,733 | B2 * | 1/2017 | Ishizaka | ............ H01L 21/28556 |
| 10,131,990 | B2 * | 11/2018 | Hirochi | ............... C23C 16/4412 |
| 10,153,132 | B2 * | 12/2018 | Takeda | .............. H01J 37/32137 |
| 2010/0264115 | A1 * | 10/2010 | Kawamura | ......... C23C 16/4585 |
| | | | | 216/67 |

(Continued)

FOREIGN PATENT DOCUMENTS

JP 2016-530565 A 9/2016
WO 2015/026482 A2 2/2015

*Primary Examiner* — Gregory A Wilson
(74) *Attorney, Agent, or Firm* — Posz Law Group, PLC

(57) ABSTRACT

A thermal treatment apparatus performs a thermal treatment on a metal-containing film formed on a substrate. The thermal treatment apparatus includes a treatment chamber that houses the substrate; a thermal treatment plate that is provided inside the treatment chamber and mounts the substrate thereon; and a moisture supply unit that supplies moisture to the metal-containing film. At the time of the thermal treatment, moisture is supplied to the metal-containing film of the substrate on the thermal treatment plate and an atmosphere in the treatment chamber is exhausted from a central portion of the treatment chamber.

10 Claims, 16 Drawing Sheets

(56) References Cited

U.S. PATENT DOCUMENTS

| | | | |
|---|---|---|---|
| 2014/0235068 A1* | 8/2014 | Ashihara | H01L 21/02164 438/771 |
| 2016/0201193 A1* | 7/2016 | Saido | C23C 16/455 118/715 |
| 2017/0186634 A1* | 6/2017 | Yanagisawa | H01L 21/67103 |

* cited by examiner

SUBSTRATE TREATMENT METHOD AND THERMAL TREATMENT APPARATUS

CROSS REFERENCE TO RELATED APPLICATIONS

This application is based upon and claims the benefit of priority of the prior Japanese Patent Application No. 2016-238138, filed in Japan on Dec. 8, 2016, the entire contents of which are incorporated herein by reference.

BACKGROUND OF THE INVENTION

1. Field of the Invention

The present invention relates to a substrate treatment method and a thermal treatment apparatus, for performing a thermal treatment on a metal-containing film formed on a substrate.

2. Description of the Related Art

In a photolithography process in a manufacturing process of a semiconductor device, for example, a resist coating treatment of applying a resist solution onto a semiconductor wafer (hereinafter, referred to as a "wafer") to form a resist film, exposure processing of exposing the resist film in a predetermined pattern, a post-exposure baking treatment (hereinafter, referred to as a "PEB treatment") of performing heating to accelerate the chemical reaction of the resist film after exposure, a developing treatment of developing the exposed resist film and so on are sequentially performed to form a predetermined resist pattern on the wafer.

In recent years, miniaturization of the resist pattern is required with higher integration of semiconductor devices. Hence, to realize the miniaturization of the resist pattern, there is proposed exposure processing using extreme ultraviolet (EUV) light. Further, a resist containing metal (hereinafter referred to as a "metal-containing resist") is proposed as the resist used for EUV from the characteristics such as high-resolution property, high etching resistance, and high sensitivity to exposure (Japanese Translation of PCT International Application Publication No. 2016-530565).

SUMMARY OF THE INVENTION

In the manufacturing process of a semiconductor device, metal greatly influences electric properties and is thus strictly managed. In this regard, a metal-containing sublimate occurs in the PEB treatment on the metal-containing resist, and it is necessary to collect the metal-containing sublimate by high rate exhaustion so as to suppress metallic contamination. In particular, the metal-containing sublimate in the case of using the metal-containing resist is small at a molecular level, so that the contamination with metal influences the electric properties of the semiconductor device.

On the other hand, when high rate exhaustion is executed in the current PEB treatment, outside air not managed in humidity flows to the inside of the treatment chamber. Earnest investigation by the present inventors shows that the metal-containing resist is high in sensitivity to moisture and therefore deteriorates the uniformity of the dimension (for example, line width) of the resist pattern under a treatment atmosphere at a humidity without a predetermined range.

As described above, there is room for improvement in the PEB treatment on the metal-containing resist in order to achieve both the suppression of metal contamination and the uniformity of the resist pattern dimension.

The present invention has been made in view of the above points and its object is to appropriately form a metal-containing film while suppressing metallic contamination during a thermal treatment in a substrate treatment using a metal-containing material.

To achieve the above object, one aspect of the present invention is a substrate treatment method for performing a thermal treatment on a metal-containing film formed on a substrate, wherein the thermal treatment is performed by mounting the substrate on a thermal treatment plate provided inside a treatment chamber, and wherein in the thermal treatment, moisture is supplied to the metal-containing film and gas inside the treatment chamber is exhausted from a central portion of the treatment chamber.

According to the one aspect of the present invention, moisture is supplied to the metal-containing film at the time when performing the thermal treatment. The supply of moisture may be performed before the thermal treatment or may be performed during the thermal treatment, namely, it is only necessary that an appropriate amount of moisture is supplied to the metal-containing film during the thermal treatment. Thus, for example, in the case where the metal-containing film is a metal-containing resist film, the dimension of the resist pattern can be made uniform. Further, gas inside the treatment chamber is being exhausted during the thermal treatment, thereby enabling collection of a metal-containing sublimate occurring during the thermal treatment to suppress metallic contamination to thereby suppress the defects of semiconductor devices.

One aspect of the present invention according to another viewpoint is a thermal treatment apparatus that performs a thermal treatment on a metal-containing film formed on a substrate, including: a treatment chamber that houses the substrate; a thermal treatment plate that is provided inside the treatment chamber and mounts the substrate thereon; a moisture supply unit that supplies moisture to the metal-containing film; and a central exhaust unit that exhausts gas inside the treatment chamber from a central portion of the treatment chamber.

According to the present invention, it is possible to appropriately form a metal-containing film while suppressing metallic contamination during a thermal treatment in a substrate treatment using a metal-containing material. In particular, in the case where the metal-containing material is a metal-containing resist, the dimension of the resist pattern can be made uniform.

DETAILED DESCRIPTION OF THE INVENTION

Hereinafter, embodiments of the present invention will be described. Note that in this specification and the drawings, components having substantially the same functional configurations are denoted by the same codes to omit duplicate description.

<Substrate Treatment System>

Figure 1:
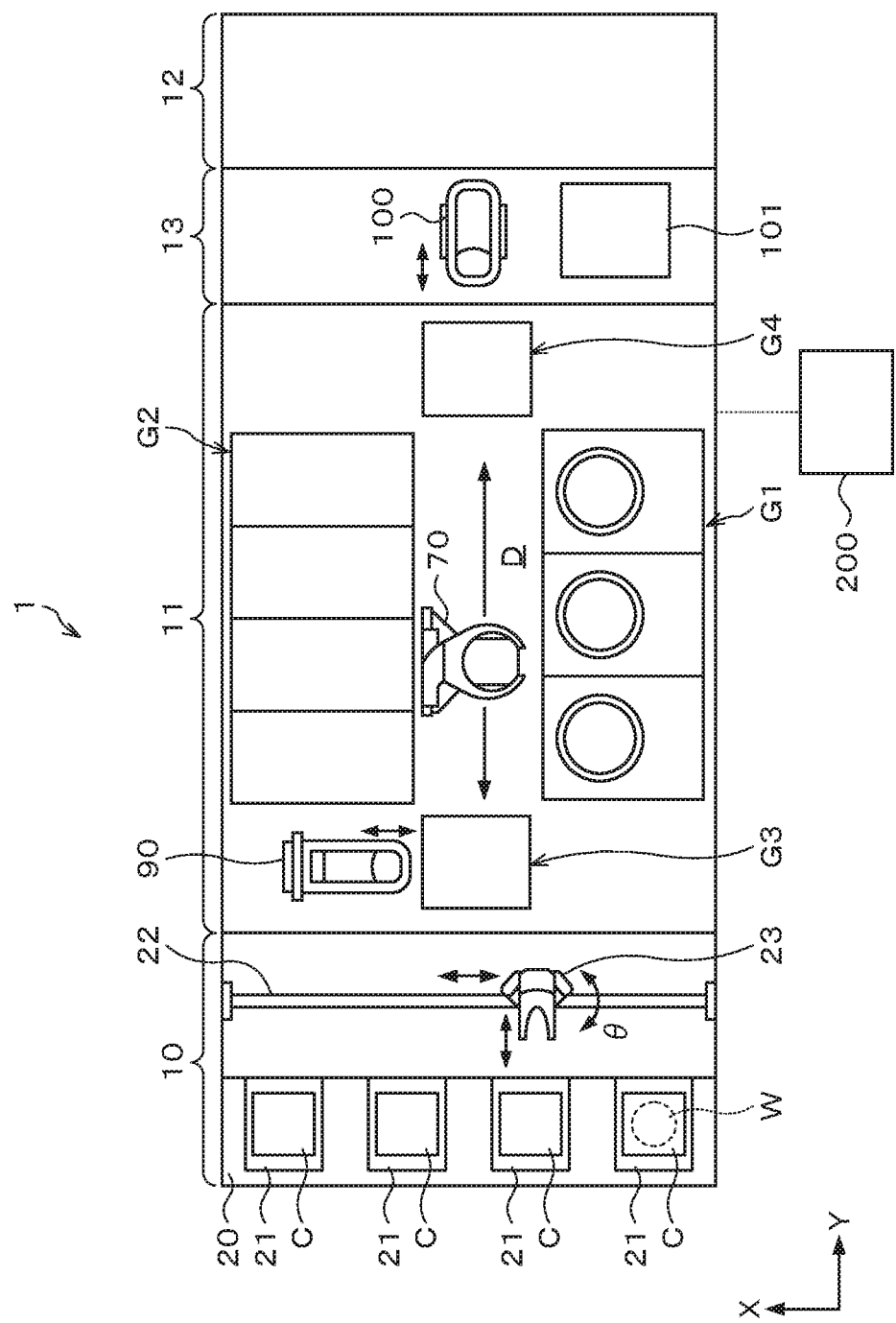
FIG. 1 is a plan view schematically illustrating the outline of a configuration of a substrate treatment system including a thermal treatment apparatus according to an embodiment.
Figure 2:
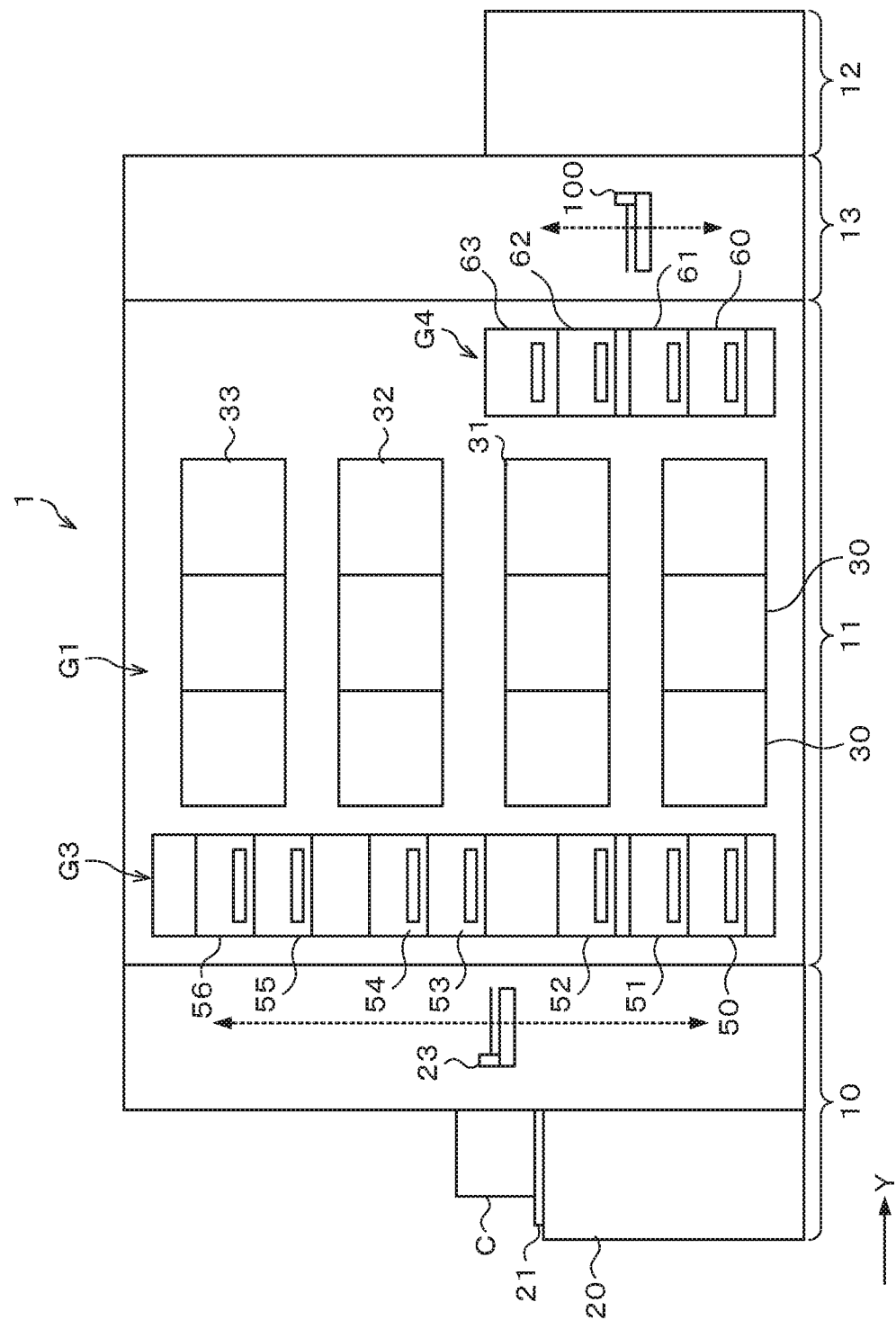
FIG. 2 is a front view schematically illustrating the outline of the configuration of the substrate treatment system including the thermal treatment apparatus according to the embodiment.
Figure 3:
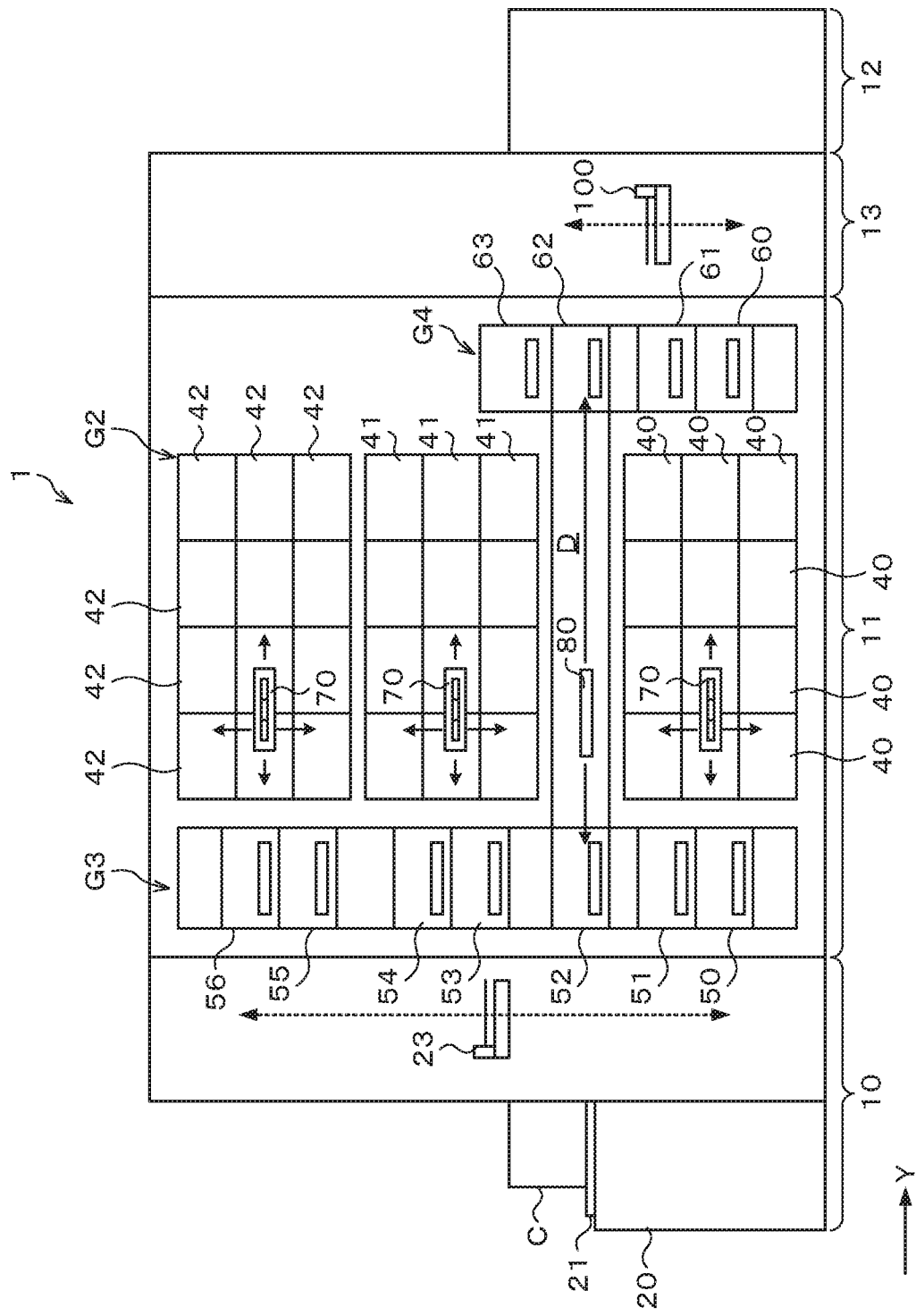
FIG. 3 is a rear view schematically illustrating the outline of the configuration of the substrate treatment system including the thermal treatment apparatus according to the embodiment.

First, a configuration of a substrate treatment system including a thermal treatment apparatus according to an embodiment will be described. FIG. 1 is a plan view schematically illustrating the outline of a configuration of a substrate treatment system 1. FIG. 2 and FIG. 3 are a front view and a rear view schematically illustrating the outline of an internal configuration of the substrate treatment system 1, respectively.

In the substrate treatment system 1, a resist pattern is formed on a wafer W as a substrate using a metal-containing resist as a metal-containing material. Note that the metal contained in the metal-containing resist is an arbitrary metal such as tin.

The substrate treatment system 1 has, as illustrated in FIG. 1, a configuration in which a cassette station 10 into/out of which a cassette C housing a plurality of wafers W is transferred, a treatment station 11 which includes a plurality of various treatment apparatuses performing predetermined treatments on the wafer W, and an interface station 13 which delivers the wafer W to/from an exposure apparatus 12 adjacent to the treatment station 11, are integrally connected.

In the cassette station 10, a cassette mounting table 20 is provided. The cassette mounting table 20 is provided with a plurality of cassette mounting plates 21 on which the cassettes C are mounted when the cassettes C are transferred in/out from/to the outside of the substrate treatment system 1.

In the cassette station 10, a wafer transfer apparatus 23 is provided which is movable on a transfer path 22 extending in an X-direction as illustrated in FIG. 1. The wafer transfer apparatus 23 is movable also in a vertical direction and around a vertical axis (in a θ-direction), and can transfer the wafer W between the cassette C on each of the cassette mounting plates 21 and a later-described delivery apparatus in a third block G3 in the treatment station 11.

In the treatment station 11, a plurality of, for example, four blocks including various apparatuses, namely, a first block G1 to a fourth block G4 are provided. For example, the first block G1 is provided on the front side (X-direction negative direction side in FIG. 1) in the treatment station 11, and the second block G2 is provided on the rear side (X-direction positive direction side in FIG. 1, the upper side in the drawing) in the treatment station 11. Further, the already-described third block G3 is provided on the cassette station 10 side (Y-direction negative direction side in FIG. 1) in the treatment station 11, and the fourth block G4 is provided on the interface station 13 side (Y-direction positive direction side in FIG. 1) in the treatment station 11.

For example, in the first block G1, as illustrated in FIG. 2, a plurality of solution treatment apparatuses, for example, developing treatment apparatuses 30 each of which performs a developing treatment on the wafer W, lower anti-reflection film forming apparatuses 31 each of which forms an anti-reflection film (hereinafter, referred to as a "lower anti-reflection film") at a lower layer of a metal-containing resist film of the wafer W, resist coating apparatuses 32 each of which applies a metal-containing resist to the wafer W to form the metal-containing resist film, and upper anti-reflection film forming apparatuses 33 each of which forms an anti-reflection film (hereinafter, referred to as an "upper anti-reflection film") at an upper layer of the metal-containing resist film of the wafer W, are arranged in this order from the bottom.

For example, the developing treatment apparatuses 30, the lower anti-reflection film forming apparatuses 31, the resist coating apparatuses 32, and the upper anti-reflection film forming apparatuses 33 are arranged three each side by side in the horizontal direction. Note that the numbers and the arrangement of the developing treatment apparatuses 30, the lower anti-reflection film forming apparatuses 31, the resist coating apparatuses 32, and the upper anti-reflection film forming apparatuses 33 can be arbitrarily selected.

In each of the developing treatment apparatus 30, the lower anti-reflection film forming apparatus 31, the resist coating apparatus 32, and the upper anti-reflection film forming apparatus 33, for example, spin coating of applying a predetermined treatment solution onto the wafer W is performed. In the spin coating, the treatment solution is discharged, for example, from a coating nozzle onto the wafer W and the wafer W is rotated to diffuse the treatment solution over the front surface of the wafer W.

For example, in the second block G2, as illustrated in FIG. 3, thermal treatment apparatuses 40 each of which performs thermal treatments such as heating and cooling on the wafer W, hydrophobizing treatment apparatuses 41 each of which performs a hydrophobizing treatment for enhancing fixation between the metal-containing resist and the wafer W, and edge exposure apparatuses 42 each of which exposes the outer peripheral portion of the wafer W to light, are provided side by side in the vertical direction and in the horizontal direction. The numbers and the arrangement of the thermal treatment apparatuses 40, the hydrophobizing treatment apparatuses 41, and the edge exposure apparatuses 42 can also be arbitrarily selected. Note that in the thermal treatment apparatus 40, a pre-baking treatment (hereinafter, referred to as a "PAB treatment") of heat-treating the wafer W after the resist coating treatment, a post-exposure baking treatment (hereinafter, referred to as a "PEB treatment") of heat-treating the wafer W after the exposure processing, a post-baking treatment (hereinafter, referred to as a "POST treatment") of heat-treating the wafer W after the developing treatment and the like are performed. The configuration of the thermal treatment apparatus 40 will be described later.

For example, in the third block G3, a plurality of delivery apparatuses 50, 51, 52, 53, 54, 55, 56 are provided in order from the bottom. Further, in the fourth block G4, a plurality of delivery apparatuses 60, 61, 62 and a rear surface cleaning apparatus 63 which cleans the rear surface of the wafer W are provided in order from the bottom.

In a region surrounded by the first block G1 to the fourth block G4, a wafer transfer region D is formed as illustrated in FIG. 1. In the wafer transfer region D, for example, a plurality of wafer transfer apparatuses 70 are arranged each of which has a transfer arm movable, for example, in the Y-direction, the X-direction, the θ-direction, and the vertical direction. The wafer transfer apparatus 70 can move in the wafer transfer region D to transfer the wafer W to a predetermined apparatus in the first block G1, the second block G2, the third block G3 and the fourth block G4 therearound.

Further, in the wafer transfer region D, a shuttle transfer apparatus 80 is provided which linearly transfers the wafer W between the third block G3 and the fourth block G4 as illustrated in FIG. 3.

The shuttle transfer apparatus 80 is configured to be linearly movable, for example, in the Y-direction in FIG. 3. The shuttle transfer apparatus 80 can move in the Y-direction while supporting the wafer W, and transfer the wafer W between the delivery apparatus 52 in the third block G3 and the delivery apparatus 62 in the fourth block G4.

As illustrated in FIG. 1, a wafer transfer apparatus 90 is provided adjacent on the X-direction positive direction side of the third block G3. The wafer transfer apparatus 90 has a transfer arm that is movable, for example, in the X-direction, the θ-direction, and the vertical direction. The wafer transfer apparatus 90 can move up and down while supporting the wafer W to transfer the wafer W to each of the delivery apparatuses in the third block G3.

In the interface station 13, a wafer transfer apparatus 100 and a delivery apparatus 101 are provided. The wafer transfer apparatus 100 has a transfer arm that is movable, for example, in the Y-direction, the θ-direction, and the vertical direction. The wafer transfer apparatus 100 can transfer the wafer W to/from each of the delivery apparatuses in the fourth block G4, the delivery apparatus 101 and the exposure apparatus 12, for example, while supporting the wafer W by the transfer arm.

The above substrate treatment system 1 is provided with a control unit 200 as illustrated in FIG. 1. The control unit 200 is, for example, a computer and has a program storage unit (not illustrated). In the program storage unit, a program for controlling the treatments on the wafer W in the substrate treatment system 1 is stored. In addition, programs for realizing a later-described hydrophobizing treatment in the substrate treatment system 1 by controlling the operations of the above-described various treatment apparatuses and the drive system such as the transfer apparatuses, are also stored in the program storage unit. Note that the programs may be the ones that are recorded, for example, in a computer-readable storage medium such as a computer-readable hard disk (HD), flexible disk (FD), compact disk (CD), magneto-optical disk (MO), or memory card, and installed from the storage medium into the control unit 200.

Figure 4:
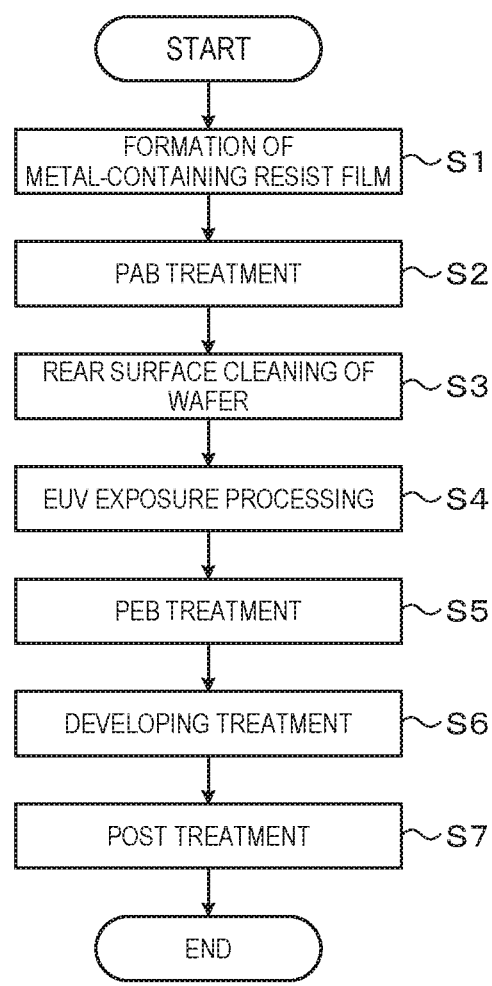
FIG. 4 is a flowchart illustrating an example of main steps of a wafer treatment according to the embodiment.

Next, the wafer treatment performed using the substrate treatment system 1 configured as described above will be described. FIG. 4 is a flowchart illustrating an example of main steps of the wafer treatment.

First, a cassette C housing a plurality of wafers W is transferred into the cassette station 10 of the substrate treatment system 1 and mounted on the cassette mounting plate 21. Then, each of the wafers W in the cassette C is successively taken out by the wafer transfer apparatus 23 and transferred to the delivery apparatus 53 in the third block G3 in the treatment station 11.

The wafer W is then transferred by the wafer transfer apparatus 70 to the thermal treatment apparatus 40 in the second block G2 and subjected to a temperature regulation treatment. Thereafter, the wafer W is transferred by the wafer transfer apparatus 70, for example, to the lower anti-reflection film forming apparatus 31 in the first block G1, in which a lower anti-reflection film is formed on the wafer W. The wafer W is thereafter transferred to the thermal treatment apparatus 40 in the second block G2 and subjected to a heat treatment. The wafer W is thereafter returned to the delivery apparatus 53 in the third block G3.

The wafer W is then transferred by the wafer transfer apparatus 90 to the delivery apparatus 54 in the same third block G3. The wafer W is thereafter transferred by the wafer transfer apparatus 70 to the hydrophobizing treatment apparatus 41 in the second block G2 and subjected to the hydrophobizing treatment.

The wafer W is then transferred by the wafer transfer apparatus 70 to the resist coating apparatus 32, in which a metal-containing resist film is formed on the wafer W (Step S1 in FIG. 4). The wafer W is thereafter transferred by the wafer transfer apparatus 70 to the thermal treatment apparatus 40 and subjected to the PAB treatment (Step S2 in FIG. 4). The wafer W is thereafter transferred by the wafer transfer apparatus 70 to the to delivery apparatus 55 in the third block G3.

Then, the wafer W is transferred by the wafer transfer apparatus 70 to the upper anti-reflection film forming apparatus 33, in which an upper anti-reflection film is formed on the wafer W. The wafer W is thereafter transferred by the wafer transfer apparatus 70 to the thermal treatment apparatus 40 and heated to be temperature-regulated. Thereafter, the wafer W is transferred to the edge exposure apparatus 42 and subjected to edge exposure processing.

The wafer W is thereafter transferred by the wafer transfer apparatus 70 to delivery apparatus 56 in the third block G3.

Then, the wafer W is transferred by the wafer transfer apparatus 90 to the delivery apparatus 52, and transferred by the shuttle transfer apparatus 80 to the delivery apparatus 62 in the fourth block G4. The wafer W is thereafter transferred by the wafer transfer apparatus 100 to the rear surface cleaning apparatus 63 and subjected to the rear surface cleaning (Step S3 in FIG. 4). The wafer W is thereafter transferred by the wafer transfer apparatus 100 in the interface station 13 to the exposure apparatus 12 and subjected to exposure processing in a predetermined pattern using EUV light (Step S4 in FIG. 4).

Then, the wafer W is transferred by the wafer transfer apparatus 100 to the delivery apparatus 60 in the fourth block G4. The wafer W is thereafter transferred by the wafer transfer apparatus 70 to the thermal treatment apparatus 40 and subjected to the PEB treatment (Step S5 in FIG. 4). The PEB treatment in the thermal treatment apparatus 40 will be described later.

Then, the wafer W is transferred by the wafer transfer apparatus 70 to the developing treatment apparatus 30 and developed (Step S6 in FIG. 4). After the development, the wafer W is transferred by the wafer transfer apparatus 90 to the thermal treatment apparatus 40 and subjected to the POST treatment (Step S7 in FIG. 4).

The wafer W is thereafter transferred by the wafer transfer apparatus 70 to the delivery apparatus 50 in the third block G3, and then transferred by the wafer transfer apparatus 23 in the cassette station 10 to the cassette C on the predetermined cassette mounting plate 21. Thus, a series of photolithography process ends.

<First Embodiment>

Figure 5:
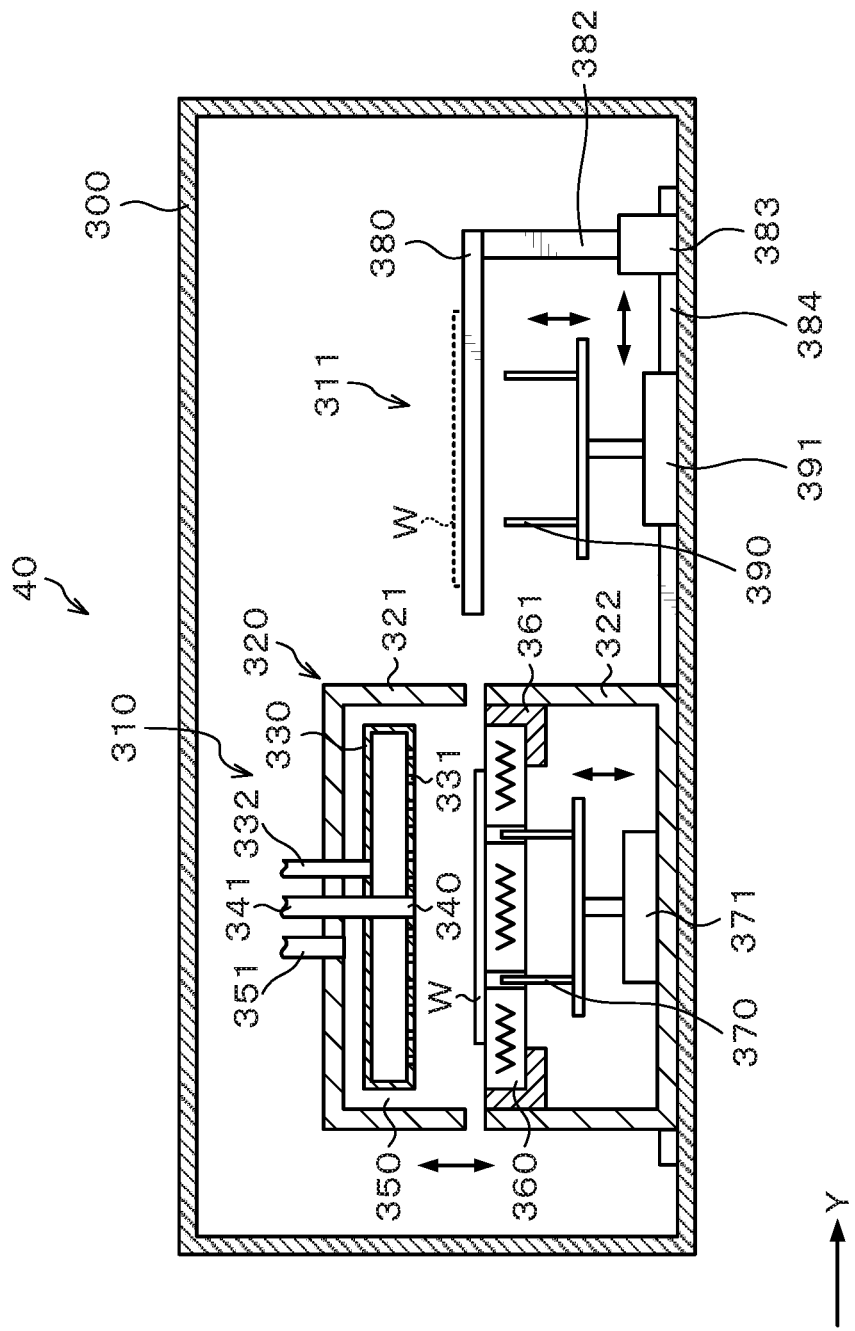
FIG. 5 is a longitudinal sectional view schematically illustrating the outline of a configuration of a thermal treatment apparatus according to a first embodiment.
Figure 6:
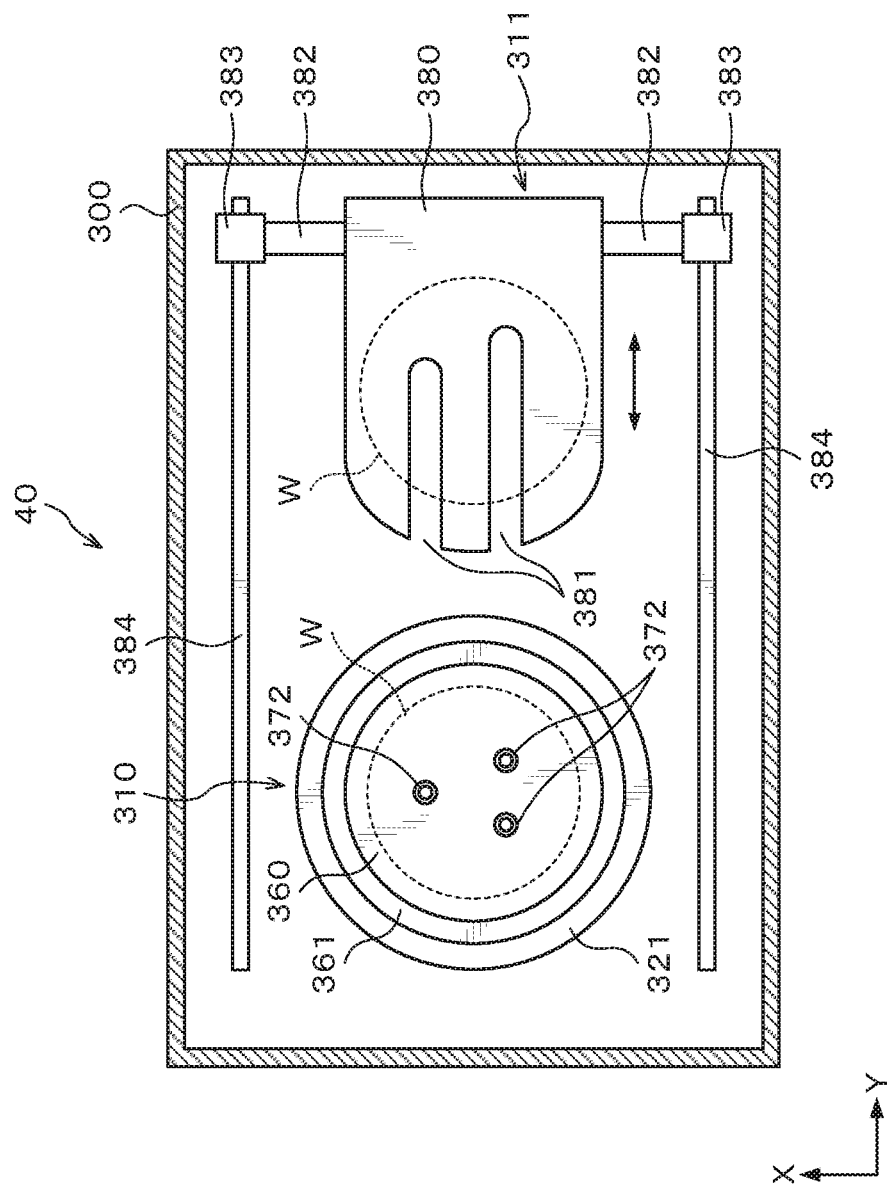
FIG. 6 is a plan view schematically illustrating the outline of the configuration of the thermal treatment apparatus according to the first embodiment.

Next, a first embodiment of the thermal treatment apparatus 40 will be described. FIG. 5 is a longitudinal sectional view schematically illustrating the outline of a configuration of a thermal treatment apparatus 40 according to the first embodiment. FIG. 6 is a plan view schematically illustrating the outline of the configuration of the thermal treatment apparatus 40 according to the first embodiment.

The thermal treatment apparatus 40 has a treatment container 300 whose inside can be closed. A side surface on the wafer transfer region D side of the treatment container 300 is formed with a transfer-in/out port (not illustrated) for the wafer W, and an opening and closing shutter (not illustrated) is provided at the transfer-in/out port.

Inside the treatment container 300, a heating unit 310 that heat-treats the wafer W and a temperature regulation unit 311 that temperature-regulates the wafer W are provided. The heating unit 310 and the temperature regulation unit 311 are arranged side by side in the Y-direction.

Figure 7:
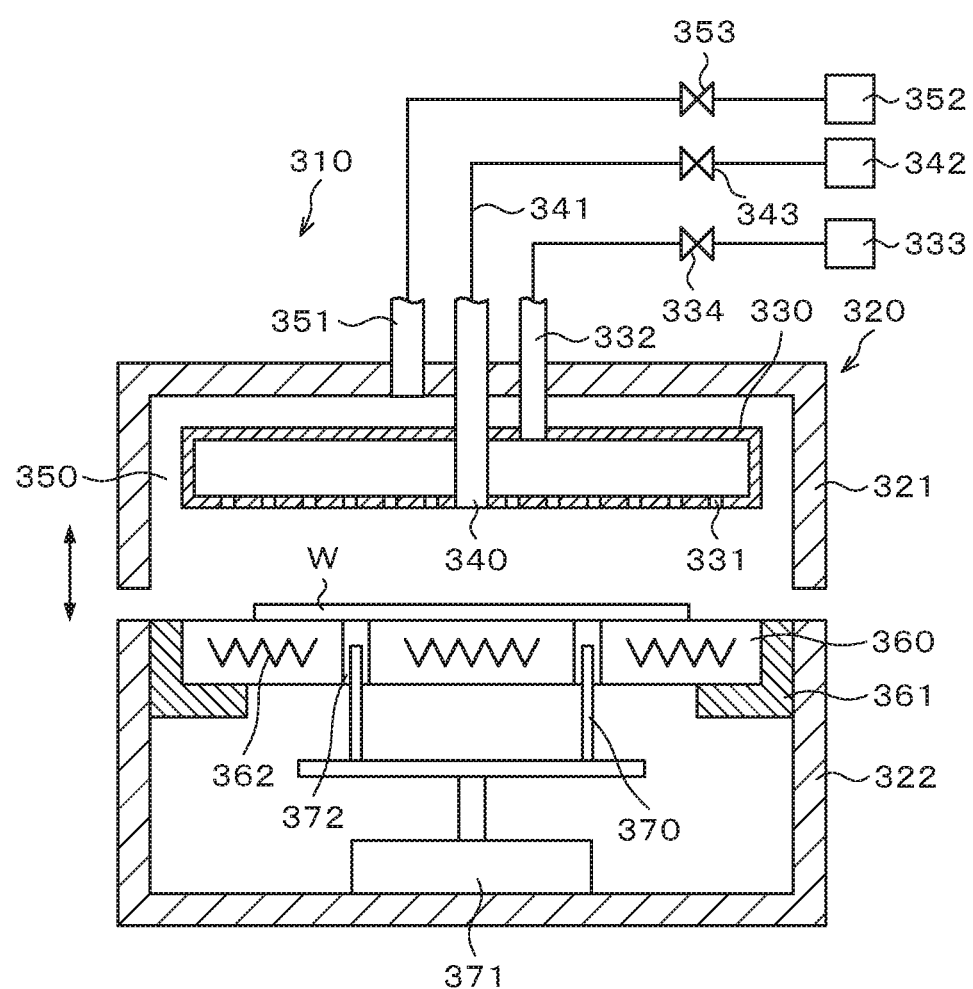
FIG. 7 is a longitudinal sectional view schematically illustrating the outline of a configuration of a heating unit according to the first embodiment.

As illustrated in FIG. 7, the heating unit 310 has a treatment chamber 320 that houses and heat-treats the wafer W. The treatment chamber 320 has an upper chamber 321 that is located on the upper side and freely rises and lowers, and a lower chamber 322 that is located on the lower side and unites with the upper chamber 321 to be able to seal an inside thereof.

The upper chamber 321 has an almost cylindrical shape with a lower surface open. Inside the upper chamber 321 and at a position facing a later-described thermal treatment plate 360, a shower head 330 is provided as a moisture supply unit that supplies a moisture-containing gas to the inside of the treatment chamber 320. The shower head 330 is configured to freely rise and lower in synchronization with the upper chamber 321.

The shower head 330 has a plurality of gas supply holes 331 formed in a lower surface thereof. The plurality of gas supply holes 331 are evenly arranged at a portion other than a later-described central exhaust path 340 in the lower surface of the shower head 330. To the shower head 330, a gas supply pipe 332 is connected. Further, to the gas supply pipe 332, a gas supply source 333 is connected which supplies moisture-containing gas to the shower head 330. The gas supply pipe 332 is provided with a valve 334 that controls flow of the moisture-containing gas.

Inside the gas supply source 333, gas having a moisture concentration adjusted, for example, to 43% to 60% is stored. The moisture-containing gas having the moisture concentration adjusted as described above is supplied to the inside of the treatment chamber 320 via the shower head 330 to thereby adjust the inside atmosphere of the treatment chamber 320 to a humidity in a predetermined range, for example, 43% to 60%.

Here, water in the treatment atmosphere in the PEB treatment accelerates an agglutination reaction of the metal-containing resist. The agglutination reaction is a reaction in which ultraviolet rays in the exposure processing cut the bond between the metal and the ligand (organometallic complex) in the metal-containing resist to produce an oxide of the metal in the PEB treatment with the ligand released. The water in the PEB treatment oxidizes the metal to accelerate the agglutination reaction. In the case where there is a large amount of water because the humidity of the inside atmosphere of the treatment chamber 320 is high, the agglutination reaction of the metal-containing resist is accelerated. Then, since the metal-containing resist is a negative-type resist, the dimension, for example, the line width of the resist pattern to be formed on the wafer W results to be large. On the other hand, in the case where there is a small amount of water because the humidity of the inside atmosphere of the treatment chamber 320 is low, the agglutination reaction of the metal-containing resist less proceeds, so that the dimension of the resist pattern results to be small. Accordingly, to appropriately control the dimension of the resist pattern, it is important to control the humidity.

Earnest investigation by the present inventors also shows that the metal-containing resist has high sensitivity to moisture as described above. It also has been found that when the inside atmosphere of the treatment chamber 320 during the PEB treatment is kept at the humidity of 43% to 60%, the dimension of the resist pattern becomes uniform within the wafer. More specifically, when the PEB treatment was performed under an atmosphere with a humidity of lower than 42%, the dimension of the resist pattern became non-uniform.

Note that the present inventors also have found that the metal-containing resist has low sensitivity to temperature.

As illustrated in FIG. 7, the shower head 330 is formed with a central exhaust path 340 extending from a lower surface central portion to an upper surface central portion of the shower head 330. To the central exhaust path 340, an central exhaust pipe 341 provided at an upper surface central portion of the upper chamber 321 is connected. Further, to the central exhaust pipe 341, an exhaust apparatus 342 such as a vacuum pump is connected. The central exhaust pipe 341 is provided with a valve 343 that controls flow of exhausted gas. Note that in this embodiment, the central exhaust path 340, the central exhaust pipe 341, the exhaust apparatus 342, and the valve 343 constitute a central exhaust unit in the present invention.

Inside the upper chamber 321 and at an outer peripheral portion of the shower head 330, an outer peripheral exhaust path 350 is formed which exhausts gas inside the treatment chamber 320 from the outer peripheral portion of the treatment chamber 320. To the outer peripheral exhaust path 350, an outer peripheral exhaust pipe 351 is connected which is provided in the upper surface of the upper chamber 321. Further, to the outer peripheral exhaust pipe 351, an exhaust apparatus 352 such as a vacuum pump is connected. The outer peripheral exhaust pipe 351 is provided with a valve 353 that controls flow of exhausted gas. Note that in this embodiment, the outer peripheral exhaust path 350, the outer peripheral exhaust pipe 351, the exhaust apparatus 352, and the valve 353 constitute an outer peripheral exhaust unit in the present invention.

The lower chamber 322 has an almost cylindrical shape with an upper surface open. At the upper surface opening portion of the lower chamber 322, the thermal treatment plate 360 and a ring-shaped holding member 361 that houses the thermal treatment plate 360 and holds an outer peripheral portion of the thermal treatment plate 360 are provided. The thermal treatment plate 360 has an almost disk shape with a large thickness and can mount and heat the wafer W thereon. Further, for example, a heater 362 is embedded inside the thermal treatment plate 360. The heating temperature of the thermal treatment plate 360 is controlled by, for example, the control unit 200, so that the wafer W mounted on the thermal treatment plate 360 is heated to a predetermined temperature.

Inside the lower chamber 322 and below the thermal treatment plate 360, for example, three raising and lowering pins 370 as a raising and lowering unit are provided which supports the wafer W from below and raises and lowers the wafer W. The raising and lowering pins 370 can move up and lower by means of a raising and lowering drive unit 371. Near the central portion of the thermal treatment plate 360, through holes 372 penetrating the thermal treatment plate 360 in the thickness direction thereof are formed, for example, at three positions. The raising and lowering pins 370 are inserted into the through holes 372 to be able to project from the upper surface of the thermal treatment plate 360.

The temperature regulation unit 311 has a temperature regulation plate 380 as illustrated in FIG. 5 and FIG. 6. The temperature regulation plate 380 has an almost square flat plate shape and has an end face on the thermal treatment plate 360 side curved in an arc shape. In the temperature regulation plate 380, two slits 381 are formed along the Y-direction. The slits 381 are formed from the end face on the thermal treatment plate 360 side of the temperature regulation plate 380 to the vicinity of the central portion of the temperature regulation plate 380. The slits 381 can prevent the temperature regulation plate 380 from interfering with the raising and lowering pins 370 of the heating unit 310 and later-described raising and lowering pins 390 of the temperature regulation unit 311. Further, in the temperature regulation plate 380, a temperature regulation member (not illustrated) such as cooling water, a Peltier element or the like is embedded. The temperature of the temperature regulation plate 380 is controlled, for example, by the control unit 200 so that the wafer W mounted on the temperature regulation plate 380 is regulated to a predetermined temperature.

The temperature regulation plate 380 is supported on a supporting arm 382. To the supporting arm 382, a drive unit 383 is attached. The drive unit 383 is attached to a rail 384 extending in the Y-direction. The rail 384 extends from the temperature regulation unit 311 to the heating unit 310. By means of the drive unit 383, the temperature regulation plate 380 can move along the rail 384 between the heating unit 310 and the temperature regulation unit 311.

Below the temperature regulation plate 380, for example, three raising and lowering pins 390 for supporting the wafer W from below and raising and lowering the wafer W are provided. The raising and lowering pins 390 can move up and down by means of a raising and lowering drive unit 391. Further, the raising and lowering pins 390 are inserted into the slits 381 to be able to project from the upper surface of the temperature regulation plate 380.

Figure 8:
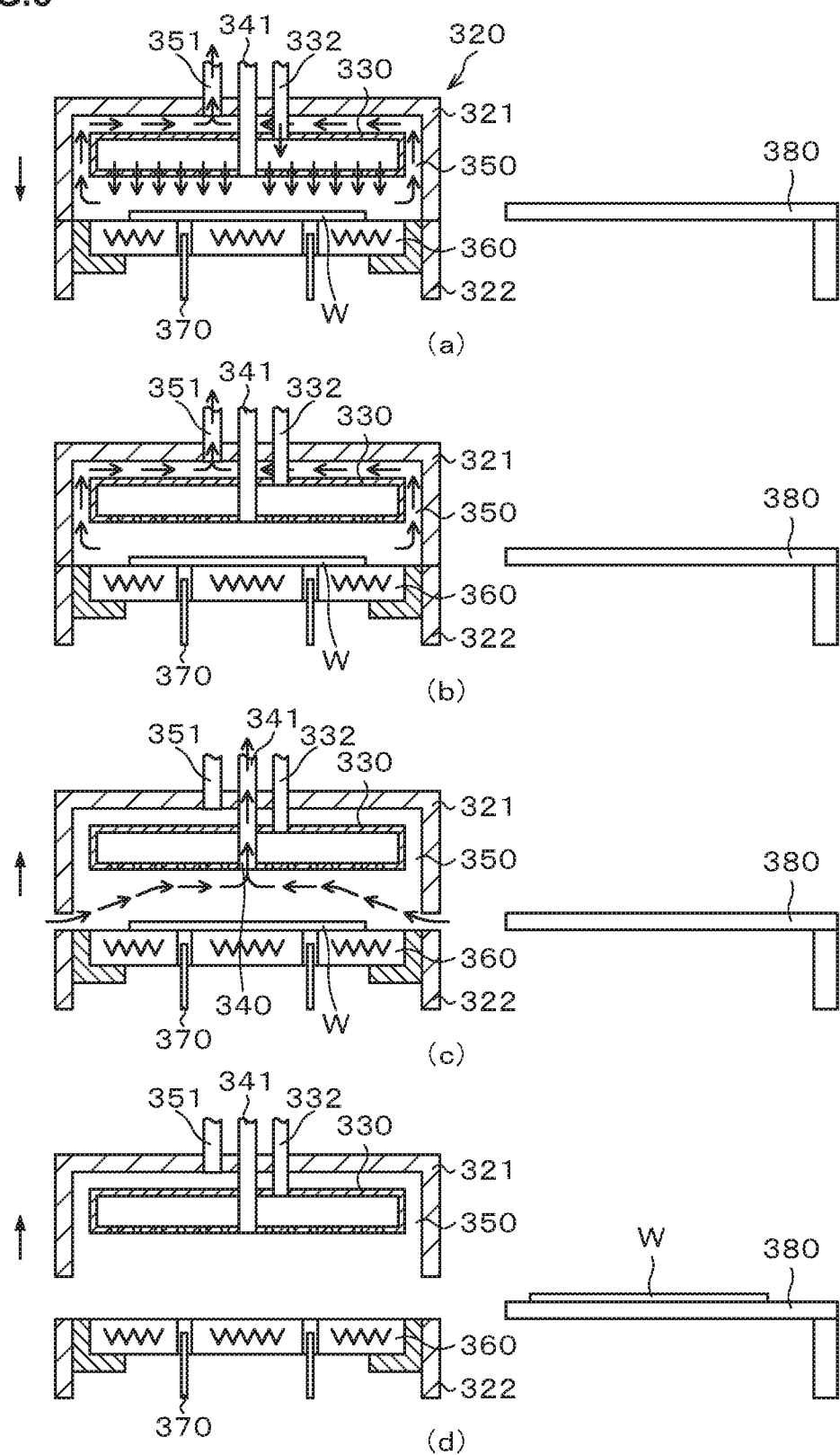
FIG. 8 is an explanatory view illustrating the operation of the thermal treatment apparatus according to the first embodiment.

Next, the PEB treatment performed using the thermal treatment apparatus 40 configured as described above will be described. FIG. 8 is an explanatory view illustrating the operation of the thermal treatment apparatus 40. Note that the wafer W transferred into the thermal treatment apparatus 40 has been formed with the metal-containing resist film.

First, when the wafer W is transferred by the wafer transfer apparatuses 70 into the thermal treatment apparatus 40, the wafer W is delivered from the wafer transfer apparatuses 70 to the raising and lowering pins 390 which have been raised and waiting in advance. Subsequently, the raising and lowering pins 390 are lowered to mount the wafer W on the temperature regulation plate 380.

Thereafter, the temperature regulation plate 380 is moved by the drive unit 383 along the rail 384 to above the thermal treatment plate 360, and the wafer W is delivered to the raising and lowering pins 370 which have been raised and waiting in advance.

Thereafter, the upper chamber 321 is lowered as illustrated in (a) of FIG. 8 to bring the upper chamber 321 and the lower chamber 322 into contact with each other, thereby sealing the inside of the treatment chamber 320. Thereafter, the raising and lowering pins 370 are lowered to mount the wafer W on the thermal treatment plate 360. The wafer W on the thermal treatment plate 360 is then heated to a predetermined temperature (Step A1).

At Step A1, the moisture-containing gas having a moisture concentration adjusted, for example, to 43% to 60% is supplied from the shower head 330 at a flow rate of, for example, 4 L/min to adjust the inside atmosphere of the treatment chamber 320 to have a humidity of, for example, 43% to 60%. The moisture contained in the moisture-containing gas condenses into dew and adheres to the metal-containing resist film on the wafer W, and this moisture accelerates the agglutination reaction of the metal-containing resist. In the agglutination reaction, the moisture oxidizes metal to condense the metal-containing resist. The agglutination reaction of the metal-containing resist is accelerated in this manner to decide the dimension of the resist pattern.

Further, since the moisture-containing gas is uniformly supplied to the wafer W from the plurality of gas supply holes 331 of the shower head 330 at Step A1, the agglutination reaction of the metal-containing resist can be performed uniformly within the wafer to make the dimension of the resist pattern uniform within the wafer.

Further, at Step A1, the gas inside the treatment chamber 320 is exhausted from the outer peripheral exhaust path 350 (outer peripheral portion of the treatment chamber 320) at a first exhaust rate, for example, 4 L/min or more. Execution of low rate exhaustion of the gas inside the treatment chamber 320 from the outer peripheral portion as described above makes it possible to perform the agglutination reaction of the metal-containing resist further uniformly within the wafer.

Note that in the heat treatment at Step A1, a metal-containing sublimate occurs from the metal-containing resist correspondingly to the proceeding of the agglutination reaction of the metal-containing resist.

Thereafter, the supply of the moisture-containing gas from the shower head 330 is stopped as illustrated in (b) of FIG. 8 to stop the agglutination reaction of the metal-containing resist (Step A2). At the stage of Step A2, since the agglutination reaction of the metal-containing resist is stopped, the resist pattern is less influenced, and occurrence of the metal-containing sublimate from the metal-containing resist is also suppressed.

Note that at Step A2, the exhaustion of the gas inside the treatment chamber 320 from the outer peripheral exhaust path 350 is to continuously performed at the above-described first exhaust rate.

Thereafter, as illustrated in (c) of FIG. 8, the upper chamber 321 is raised to make outside air flow from the outer peripheral portion to the inside of the treatment chamber 320, and the gas inside the treatment chamber 320 is exhausted from the central exhaust path 340 (central portion of the treatment chamber 320) at a second exhaust rate, for example, 20 L/min to 70 L/min, higher than the first exhaust rate (Step A3). Execution of high rate exhaustion of the gas inside the treatment chamber 320 from the central portion enables collection of the metal-containing sublimate inside the treatment chamber 320 to decrease the concentration of the metal-containing sublimate. Accordingly, it is possible to suppress metallic contamination to suppress defects of semiconductor devices.

Further, at Step A3, the gas is exhausted from the central portion of the treatment chamber 320 and the outside air is made to flow in from the outer peripheral portion of the treatment chamber 320, thus preventing the metal-containing sublimate from leaking to the outside. Accordingly, it is possible to further suppress metallic contamination.

Note that at Step A3, the gas may be exhausted also from the outer peripheral portion in addition to exhaustion from the central portion of the treatment chamber 320. However, since exhaustion can be performed at a higher rate in the case of a smaller number of paths provided for exhaustion, exhaustion only from the central portion is preferable.

Thereafter, as illustrated in (d) of FIG. 8, the upper chamber 321 is further raised. Then, the wafer W is raised by the raising and lowering pins 370 and the temperature regulation plate 380 is moved to above the thermal treatment plate 360, and the wafer W is subsequently delivered from the raising and lowering pins 370 to the temperature regulation plate 380. The temperature regulation plate 380 is thereafter moved to the wafer transfer region D side, and during the movement of the temperature regulation plate 380, the wafer W is regulated to a predetermined temperature (Step A4).

According to this embodiment, the moisture-containing gas is supplied to the inside of the treatment chamber 320 at Step A1, and thereby can accelerate the agglutination reaction of the metal-containing resist to make the dimension of the resist pattern uniform. Further, execution of high rate exhaustion of the gas inside the treatment chamber 320 at Step A3 enables collection of the metal-containing sublimate occurring at Step A1 to suppress metallic contamination. As a result, it is possible to suppress defects of semiconductor devices. Further, suppression of metallic contamination also produces effects of suppressing frequencies of cleaning and maintenance of the treatment chamber 320.

In the above embodiment, the case where the agglutination reaction of the metal-containing resist is accelerated at Step A1 and then the supply of the moisture-containing gas is stopped at Step A2 to stop the agglutination reaction of the metal-containing resist has been described. In this case, occurrence of the metal-containing sublimate is reduced at Step A2.

On the other hand, there is a case where, for example, after finish of Step A1, the ligand in the metal-containing resist is not completely released but a portion thereof remains, so that the agglutination reaction of the metal-containing resist does not stop even when the supply of the moisture-containing gas is stopped at Step A2. In this case, the metal-containing sublimate continuously occurs and does not reduces even at Step A2.

Figure 9:
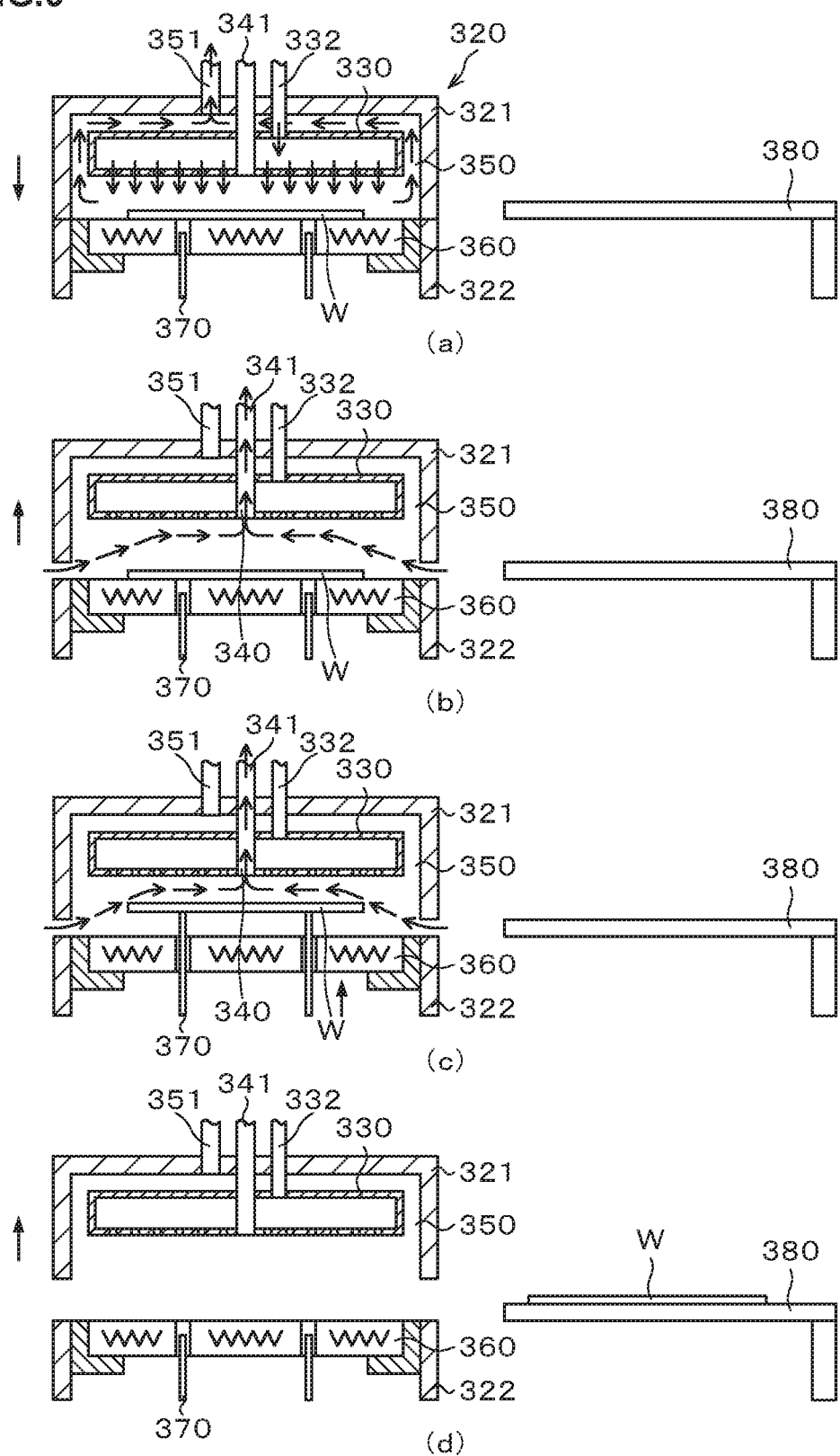
FIG. 9 is an explanatory view illustrating the operation of the thermal treatment apparatus according to the first embodiment, (a) illustrating a state where a moisture-containing gas is supplied while the wafer is being heated on a thermal treatment plate of a sealed treatment chamber, (b) illustrating a state where supply of the moisture-containing gas is stopped and an atmosphere in the treatment chamber is being exhausted, (c) illustrating a state where the wafer is raised by raising and lowering pins, and (d) illustrating a state where an upper chamber is further raised.

In the following, a case where the metal-containing sublimate continuously occurs even when the supply of the moisture-containing gas is stopped as described above, will be described as a modified example of the first embodiment. FIG. 9 is an explanatory view illustrating the operation of the thermal treatment apparatus 40.

First, in the state where the inside of the treatment chamber 320 is sealed as illustrated in (a) of FIG. 9, the wafer W is mounted on the thermal treatment plate 360 and heated to a predetermined temperature (Step B1). This Step B1 is the same as the above-described Step A1. More specifically, at Step B1, the moisture-containing gas having a moisture concentration adjusted, for example, to 43% to 60% is supplied from the shower head 330 at a flow rate of, for example, 4 L/min to adjust the inside atmosphere of the treatment chamber 320 to have a humidity of, for example, 43% to 60%. This accelerates the agglutination reaction of the metal-containing resist. Further, the gas inside the treatment chamber 320 is exhausted from the outer peripheral exhaust path 350 (outer peripheral portion of the treatment chamber 320) at a first exhaust rate, for example, 4 L/min or more.

Thereafter, the supply of the moisture-containing gas from the shower head 330 is stopped and the exhaustion of the gas inside the treatment chamber 320 from the outer peripheral exhaust path 350 is stopped as illustrated in (b) of FIG. 9. Then, the upper chamber 321 is raised to make the outside air flow from the outer peripheral portion to the inside of the treatment chamber 320, and the gas inside the treatment chamber 320 is exhausted from the central exhaust path 340 (central portion of the treatment chamber 320) at a second exhaust rate, for example, 20 L/min to 70 L/min (Step B2).

Although the supply of the moisture-containing gas is stopped at Step B2, the wafer W is mounted on the thermal treatment plate 360 and therefore the metal-containing sublimate continuously occurs. Hence, execution of high rate exhaustion of the gas inside the treatment chamber 320 from the central portion enables collection of the continuously occurring metal-containing sublimate to decrease the concentration of the metal-containing sublimate inside the treatment chamber 320 as described above.

Thereafter, at the point in time when the collection of the metal-containing sublimate at Step B2 to some extent is finished, the wafer W is raised by the raising and lowering pins 370 as illustrated in (c) of FIG. 9 and thereby the wafer W is separated from the thermal treatment plate 360, and the exhaustion of gas from the central exhaust path 340 is continuously performed (Step B3). More specifically, the gas inside the treatment chamber 320 is exhausted from the central portion of the treatment chamber 320 at a second exhaust rate, for example, 20 L/min to 70 L/min.

At Step B3, since the wafer W is separated from the thermal treatment plate 360, the thermal treatment on the wafer W is stopped and the agglutination reaction of the metal-containing resist is also stopped. Then, occurrence of the metal-containing sublimate from the metal-containing resist is also suppressed.

Further, at Step B3, execution of high rate exhaustion of the gas inside the treatment chamber 320 from the central portion enables collection of the metal-containing sublimate inside the treatment chamber 320 to decrease the concentration of the metal-containing sublimate. Accordingly, the metallic contamination can be suppressed. Further, at Step B3, the gas is exhausted from the central portion of the treatment chamber 320 and the outside air is made to flow in from the outer peripheral portion of the treatment chamber 320, thus preventing the metal-containing sublimate from leaking to the outside of the treatment chamber 320. Accordingly, it is possible to further suppress metallic contamination.

Thereafter, as illustrated in (d) of FIG. 9, the upper chamber 321 is further raised. Then, the wafer W is delivered from the raising and lowering pins 370 to the temperature regulation plate 380, and during the movement of the temperature regulation plate 380, the wafer W is regulated to a predetermined temperature (Step B4). This Step B4 is the same as the above-described Step A4.

This embodiment can produce the same effects as those in the above embodiment. More specifically, supply of the moisture-containing gas to the inside of the treatment chamber 320 at Step B1 can accelerate the agglutination reaction of the metal-containing resist to make the dimension of the resist pattern uniform. Further, execution of high rate exhaustion of the gas inside the treatment chamber 320 from the central portion at Step B2 and Step B3 enables collection of the metal-containing sublimate to suppress metallic contamination.

Note that although the case where the metal-containing resist is used as the metal-containing material has been described in the first embodiment, the first embodiment is also applicable to other metal-containing materials. For example, a metal hard mask material may be used as the metal-containing material. The metal contained in the metal hard mask material is an arbitrary metal such as titanium, zirconium or the like.

To realize the miniaturization of the resist pattern, it is proposed in recent years to form a metal hard mask on the wafer W. A current problem in forming the metal hard mask is that at the time when the metal hard mask material is applied onto the wafer W by spin coating and then a thermal treatment on the metal hard mask or a thermal treatment after wet etching the metal hard mask is performed, the film thickness is not uniform within the wafer in some cases.

Earnest investigation by the present inventors shows that the cause of nonuniformity of the wet etching is film quality unevenness of the metal hard mask, and the film quality unevenness is caused from the atmosphere at the time when performing a thermal treatment on the metal hard mask made by spin coating. For example, when the gas is exhausted from one end of the outer peripheral portion of the wafer W, gas currents toward the one end occur within the wafer. Besides, when the gas is exhausted from the central portion of the wafer W, gas currents from the outer peripheral portion toward the center portion occur within the wafer. Such gas currents cause the film quality unevenness of the metal hard mask.

Besides, when the metal hard mask is subjected to the thermal treatment, the metal-containing sublimate occurs similarly to the metal-containing resist. Accordingly, it is necessary to collect the metal-containing sublimate to suppress metallic contamination.

In this regard, in the case where the metal hard mask material is used as the metal-containing material in the first embodiment, the moisture-containing gas is uniformly supplied from the shower head 330 and the gas inside the treatment chamber 320 is uniformly exhausted from the outer peripheral exhaust path 350 Step A1 and Step B1, thereby making the gas currents within the wafer W uniform. Accordingly, it is possible to suppress the film quality unevenness of the metal hard mask so as to make the film quality uniform and uniformly perform wet etching on the metal hard mask.

Further, at Step A1 and Step B1, the moisture contained in the moisture-containing gas can accelerate the agglutination reaction of the metal hard mask.

Further, high rate exhaustion of the gas inside the treatment chamber 320 from the central exhaust path 340 is executed at Step A3 and Steps B2, B3 enables collection of the metal-containing sublimate inside the treatment chamber 320 to decrease the concentration of the metal-containing sublimate. Accordingly, the metallic contamination can be suppressed. As a result of this, it is possible to suppress the defects of the wafer W during treatment, and suppress occurrence of defects due to metal adhering to subsequent wafers W. It is also possible to suppress the metal-containing sublimate from leaking to the outside at the time when raising the upper chamber 321 for replacing the wafer W.

<Second Embodiment>

Next, a second embodiment of the thermal treatment apparatus 40 will be described. The thermal treatment apparatus 40 in the second embodiment has a configuration of the heating unit 310 changed from that of the thermal treatment apparatus 40 in the first embodiment and has the same configuration regarding other than that.

Figure 10:
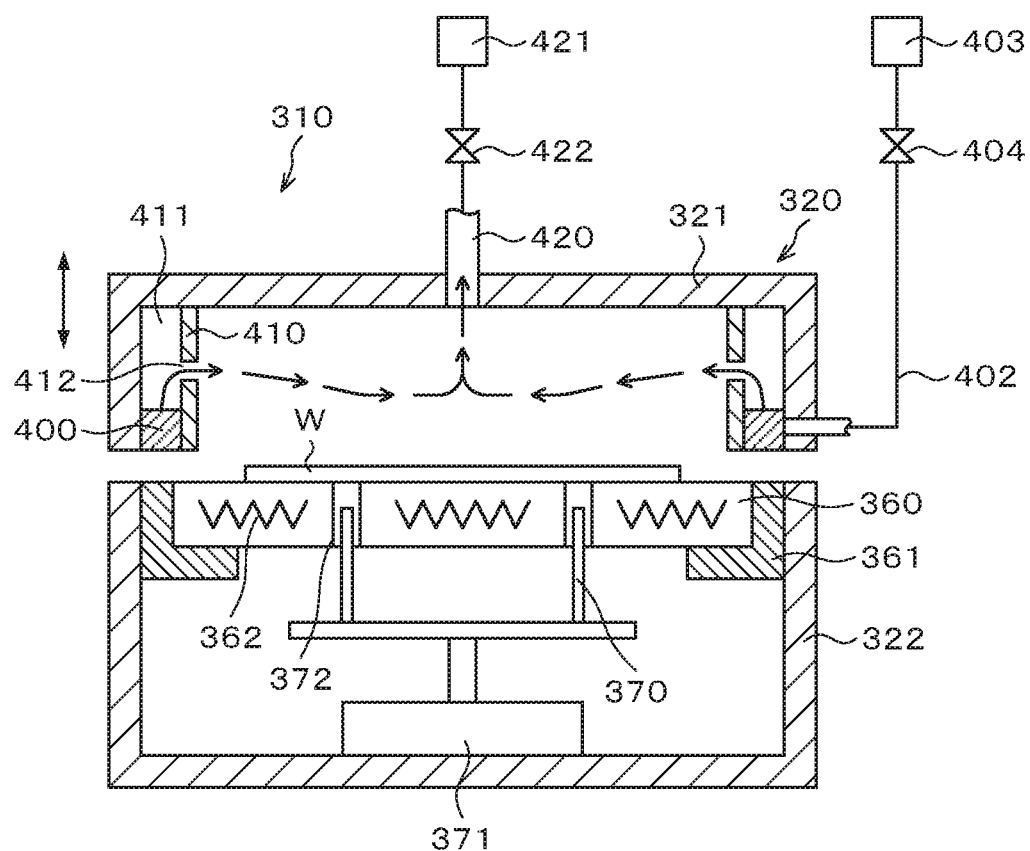
FIG. 10 is a longitudinal sectional view schematically illustrating the outline of a configuration of a heating unit according to a second embodiment.

First, the configuration of the heating unit 310 will be described. FIG. 10 is a longitudinal sectional view schematically illustrating the outline of a configuration of a heating unit 310 according to the second embodiment.

Inside an upper chamber 321 of the heating unit 310, a gas supply ring 400 as a moisture supply unit that supplies a moisture-containing gas to the inside of a treatment chamber 320 is provided in place of the shower head 330 in the first embodiment. The gas supply ring 400 is provided in a ring shape along the outer peripheral portion of the upper chamber 321.

Figure 11:
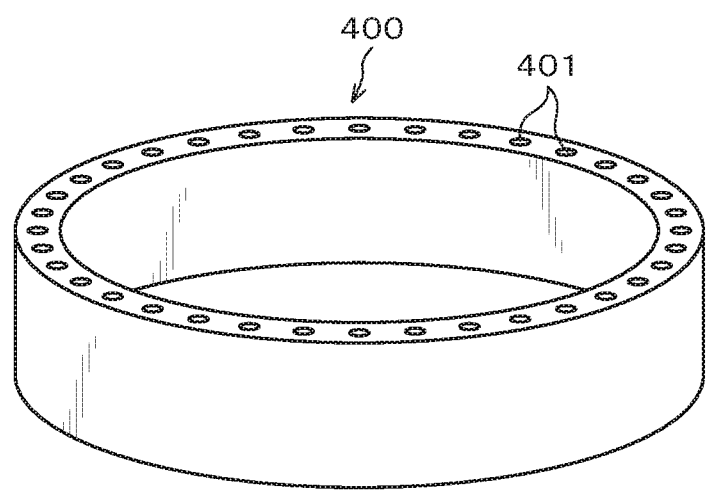
FIG. 11 is a perspective view schematically illustrating the outline of a configuration of gas supply ring according to the second embodiment.

As illustrated in FIG. 11, an upper surface of the gas supply ring 400 is formed with a plurality of gas supply holes 401 at regular intervals on a circumference of the gas supply ring 400. The gas supply ring 400 can uniformly supply the moisture-containing gas upward via the plurality of gas supply holes 401.

As illustrated in FIG. 10, to the gas supply ring 400, a gas supply pipe 402 is connected. Further, to the gas supply pipe 402, a gas supply source 403 is connected which supplies the moisture-containing gas to the gas supply ring 400. The gas supply pipe 402 is provided with a valve 404 that controls flow of the moisture-containing gas.

Inside the gas supply source 403, gas having a moisture concentration adjusted, for example, to 43% to 60% is stored as with the gas supply source 333 in the first embodiment. The moisture-containing gas having the moisture concentration adjusted as described above is supplied to the inside of the treatment chamber 320 via the gas supply ring 400 to thereby adjust the inside atmosphere of the treatment chamber 320 to a humidity in a predetermined range, for example, 43% to 60%.

At the outer peripheral portion of the upper chamber 321 and on an inside of the gas supply ring 400, an inside shutter 410 is provided as a gas flow unit in a ring shape. More specifically, a gas flow path 411 surrounded by the upper chamber 321, the gas supply ring 400, and the inside shutter 410 is formed in a ring shape along the outer peripheral portion of the upper chamber 321. Further, to prevent the outside air from flowing into the gas flow path 411, seal-up is made between each two of the upper chamber 321, the gas supply ring 400, and the inside shutter 410.

Figure 12:
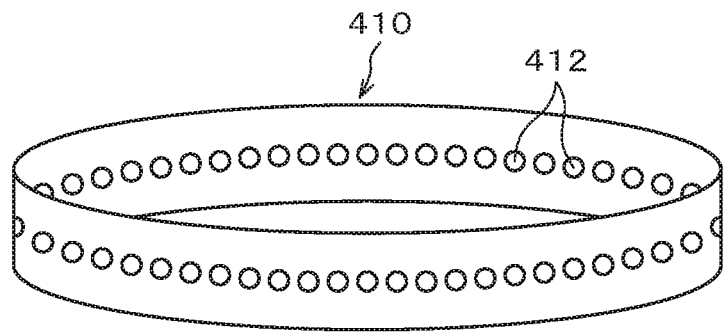
FIG. 12 is a perspective view schematically illustrating the outline of a configuration of an inside shutter according to the second embodiment.

As illustrated in FIG. 12, the inside shutter 410 is formed with a plurality of gas flow holes 412 at regular intervals on a circumference of the inside shutter 410. The inside shutter 410 can supply uniformly in the horizontal direction the moisture-containing gas toward the inside of the treatment chamber 320 via the gas flow holes 412.

To an upper surface central portion of the upper chamber 321, a central exhaust pipe 420 is connected. Further, to the central exhaust pipe 420, an exhaust apparatus 421 such as a vacuum pump is connected. The central exhaust pipe 420 is provided with a valve 422 that controls flow of exhausted gas. Note that in this embodiment, the central exhaust pipe 420, the exhaust apparatus 421, and the valve 422 constitute a central exhaust unit in the present invention.

Note that the other configuration of the heating unit 310 is the same as the configuration of the heating unit 310 in the first embodiment, and therefore description thereof is omitted.

In the heating unit 310 configured as described above, in the state where the inside of the treatment chamber 320 is sealed, the wafer W is mounted on the thermal treatment plate 360 and heated to a predetermined temperature (PEB treatment).

In the PEB treatment, the moisture-containing gas having a moisture concentration adjusted, for example, to 43% to 60% is supplied from the gas supply ring 400 toward the inside of the treatment chamber 320 via the inside shutter 410, for example, at a flow rate of 20 L/min to 70 L/min to adjust the inside atmosphere of the treatment chamber 320, for example, to have a humidity of 43% to 60%. The adjustment of the inside atmosphere of the treatment chamber 320 to a predetermined humidity can accelerate the agglutination reaction of the metal-containing resist to make the dimension of the resist pattern uniform.

Further, in the PEB treatment, the gas inside the treatment chamber 320 is exhausted from the central exhaust pipe 420 (central portion of the treatment chamber 320) at, for example, 20 L/min to 70 L/min. Execution of high rate exhaustion of the gas inside the treatment chamber 320 from the central portion as described above enables collection of the metal-containing sublimate inside the treatment chamber 320 to decrease the concentration of the metal-containing sublimate. Accordingly, the metallic contamination can be suppressed.

Note that in the PEB treatment, the flow rate of the moisture-containing gas supplied from the gas supply ring 400 and the exhaust rate of gas exhausted from the central exhaust pipe 420 are substantially the same.

Although the case of using the metal-containing resist as the metal-containing material is described in the second embodiment, the second embodiment is also applicable to other metal-containing materials, for example, a metal hard mask material as in the first embodiment.

<Third Embodiment>

Although the moisture-containing gas is supplied to the inside of the treatment chamber 320 during the PEB treatment in the above first embodiment and second embodiment, moisture may be supplied to the metal-containing resist film before the PEB treatment. Further, the supply of moisture before the PEB treatment may be performed inside the thermal treatment apparatus 40 or may be performed outside the thermal treatment apparatus 40.

Figure 13:
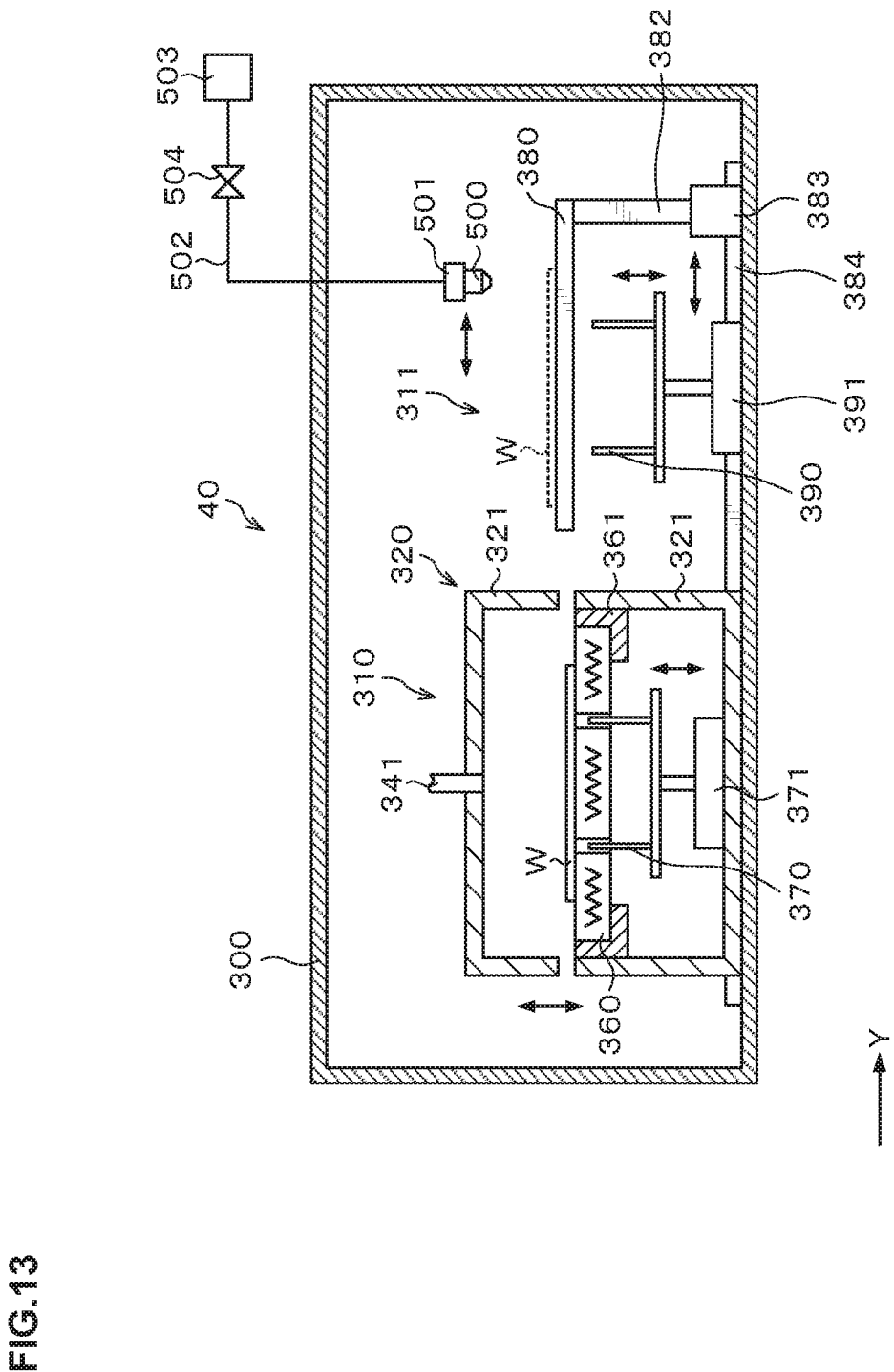
FIG. 13 is a longitudinal sectional view schematically illustrating the outline of a configuration of a thermal treatment apparatus according to a third embodiment.

First, a case where the supply of moisture before the PEB treatment is performed inside the thermal treatment apparatus 40 will be described. FIG. 13 is a longitudinal sectional view schematically illustrating the outline of a configuration of a thermal treatment apparatus 40 according to the third embodiment.

The thermal treatment apparatus 40 has the same configuration as that of the thermal treatment apparatus 40 in the first embodiment, and a water supply nozzle 500 as a moisture supply unit that supplies the moisture-containing gas to the metal-containing resist film on the wafer W is provided inside the treatment container 300. Note that the moisture-containing gas may contain liquid water (mist). The water supply nozzle 500 may discharge the liquid water.

The water supply nozzle 500 is provided above the temperature regulation plate 380 of the temperature regulation unit 311 and is configured to be movable in the horizontal direction by a moving mechanism 501. Further, the water supply nozzle 500 has a long and thin shape having the same as or longer than the diameter of the wafer W, and a discharge port of the water supply nozzle 500 is formed in a slit shape. The water supply nozzle 500 discharges the moisture-containing gas while moving in the horizontal direction above the wafer W, thereby supplying the moisture-containing gas to the entire surface of the metal-containing resist film on the wafer W. The supplied moisture-containing gas condenses into dew and adheres to the metal-containing resist film, whereby water is supplied to the entire surface of the metal-containing resist film.

To the water supply nozzle 500, a water supply pipe 502 is connected. Further, to the water supply pipe 502, a water supply source 503 is connected which supplies the moisture-containing gas to the water supply nozzle 500. The water supply pipe 502 is provided with a valve 504 that controls flow of the moisture-containing gas.

Note that in the upper chamber 321 of the heating unit 310, the shower head 330, the gas supply pipe 332, the gas supply source 333, the valve 334, the outer peripheral exhaust path 350, the outer peripheral exhaust pipe 351, the exhaust apparatus 352, and the valve 353 in the first embodiment are omitted. More specifically, the central exhaust pipe 341, the exhaust apparatus 342, and the valve 343 are provided in the upper chamber 321.

Next, the PEB treatment performed using the thermal treatment apparatus 40 configured as described above will be described.

First, when the wafer W is transferred by the wafer transfer apparatuses 70 into the thermal treatment apparatus 40, the wafer W is delivered from the wafer transfer apparatuses 70 to the raising and lowering pins 390 which have been raised and waiting in advance. Subsequently, the raising and lowering pins 390 are lowered to mount the wafer W on the temperature regulation plate 380.

Thereafter, the water supply nozzle 500 discharges the moisture-containing gas while the water supply nozzle 500 is being moved by the moving mechanism 501 in the horizontal direction above the wafer. The discharged moisture-containing gas condenses into dew and adheres to the metal-containing resist film, whereby water is supplied to the entire surface of the metal-containing resist film. Note that the supply amount of wafer in this event is an amount corresponding to the predetermined humidity of the inside atmosphere of the treatment chamber 320 in the above-described first embodiment, for example, 43% to 60%.

Thereafter, the temperature regulation plate 380 is raised by the drive unit 383 along the rail 384 to above the thermal treatment plate 360, and the wafer W is delivered to the raising and lowering pins 370 which have been raised and waiting in advance.

Then, the upper chamber 321 is lowered to bring the upper chamber 321 and the lower chamber 322 into contact with each other, thereby sealing the inside of the treatment chamber 320. Thereafter, the raising and lowering pins 370 are lowered to mount the wafer W on the thermal treatment plate 360. The wafer W on the thermal treatment plate 360 is then heated to a predetermined temperature.

In the heat treatment on the wafer W, water has been supplied onto the metal-containing resist film in advance and therefore can accelerate the agglutination reaction of the metal-containing resist to make the dimension of the resist pattern uniform.

Further, in the heat treatment on the wafer W, the gas inside the treatment chamber 320 is exhausted from the central exhaust pipe 341 (central portion of the treatment chamber 320) at, for example, 20 L/min to 70 L/min. Execution of high rate exhaustion of the gas inside the treatment chamber 320 from the central portion enables collection of the metal-containing sublimate inside the treatment chamber 320 to decrease the concentration of the metal-containing sublimate. Accordingly, it is possible to suppress metallic contamination.

Thereafter, the upper chamber 321 is raised. Then, the wafer W is raised by the raising and lowering pins 370 and the temperature regulation plate 380 is moved to above the thermal treatment plate 360, and the wafer W is subsequently delivered from the raising and lowering pins 370 to the temperature regulation plate 380. The temperature regulation plate 380 is thereafter moved to the wafer transfer region D side, and during the movement of the temperature regulation plate 380, the wafer W is regulated to a predetermined temperature.

Note that in the case where the supply of moisture before the PEB treatment is performed inside the thermal treatment apparatus 40, the moisture supply unit is not limited to the water supply nozzle 500. For example, the water supply nozzle 500 may be provided at the transfer-in/out port for the wafer W formed at the treatment container 300, in which case the moisture-containing gas is supplied from the water supply nozzle 500 to the wafer W transferred into the treatment container 300.

Figure 14:
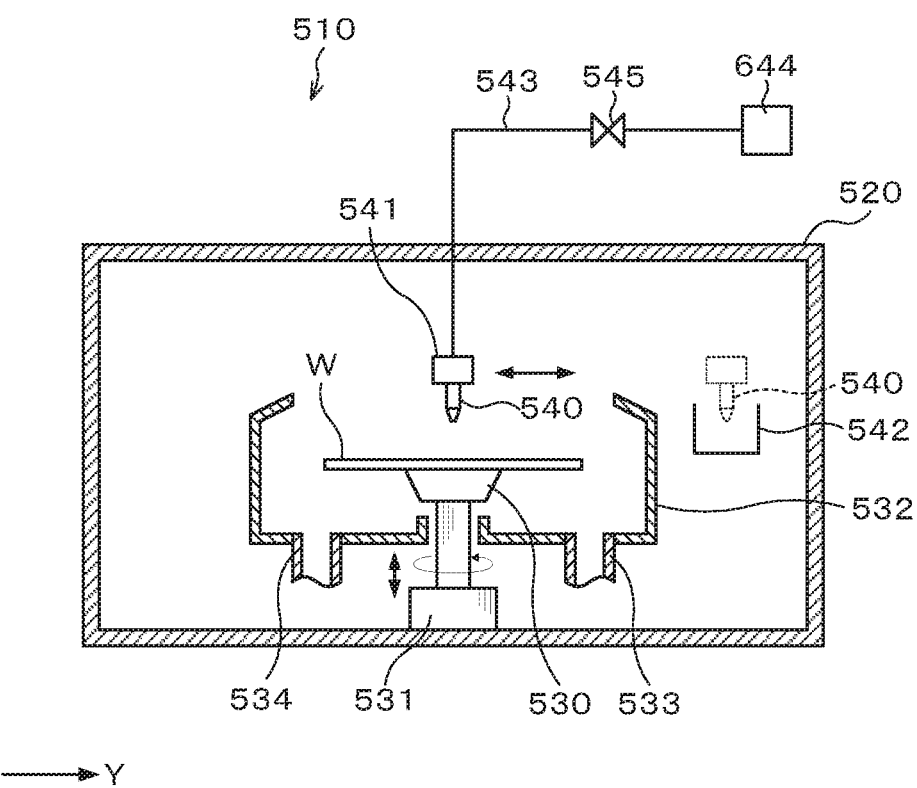
FIG. 14 is a longitudinal sectional view schematically illustrating the outline of a configuration of a water coating apparatus according to the third embodiment.

Next, a case where the supply of moisture before the PEB treatment is performed outside the thermal treatment apparatus 40 will be described. FIG. 14 is a longitudinal sectional view schematically illustrating the outline of a configuration of a water coating apparatus 510 according to the third embodiment.

The water coating apparatus 510 has a treatment container 520 whose inside can be closed. A side surface on the wafer transfer region D side of the treatment container 520 is formed with a transfer-in/out port (not illustrated) for the wafer W, and an opening and closing shutter (not illustrated) is provided at the transfer-in/out port.

At a central portion in the treatment container 520, a spin chuck 530 that holds and rotates the wafer W is provided. The spin chuck 530 has a horizontal upper surface, and the upper surface is provided with, for example, a suction port (not illustrated) that sucks the wafer W. By suction through the suction port, the wafer W can be suction-held on the spin chuck 530.

Below the spin chuck 530, a drive unit 531 including, for example, a motor is provided. The spin chuck 530 can rotate at a predetermined speed by the drive unit 531. Further, the drive unit 531 is provided with a raising and lowering drive source such as a cylinder so that the spin chuck 530 can freely rise and lower.

Around the spin chuck 530, a cup 532 is provided which receives and collects liquid splashing or dropping from the wafer W. A drain pipe 533 that drains the collected liquid and an exhaust pipe 534 that evacuates and exhausts the atmosphere inside the cup 532 are connected to a lower surface of the cup 532.

Above the spin chuck 530, a water supply nozzle 540 as a moisture supply unit that supplies liquid water to the metal-containing resist film on the wafer W is provided. The water supply nozzle 540 is configured to be movable in the horizontal direction by a moving mechanism 541. Thus, the water supply nozzle 540 can move from a waiting section 542 set outside the cup 532 to above the center portion of the wafer W in the cup 532, and can further move in a radial direction of the wafer W above the wafer W.

To the water supply nozzle 540, a water supply pipe 543 is connected. Further, to the water supply pipe 543, a water supply source 544 is connected which supplies water to the water supply nozzle 540. The water supply pipe 543 is provided with a valve 545 that controls flow of the water.

In the water coating apparatus 510, the wafer W is held by the spin chuck 530, and then the water supply nozzle 540 is moved by the moving mechanism 541 to above the center portion of the wafer W. Thereafter, water is supplied from the water supply nozzle 540 to the wafer W while the wafer W is being rotated by the spin chuck 530. The supplied water is diffused on the entire surface of the wafer W by the centrifugal force, whereby the entire surface of the metal-containing resist film on the wafer W is coated with the water. Note that the supply amount of water in this event is an amount corresponding to the predetermined humidity of the inside atmosphere of the treatment chamber 320 in the above-described first embodiment, for example, 43% to 60%.

The water coating apparatus 510 in the above configuration is disposed, for example, in the first block G1 of the substrate treatment system 1.

The supply of water to the metal-containing resist film in the water coating apparatus 510 is performed at any one of steps after the PAB treatment at Step S2 illustrated in FIG. 4 and before the PEB treatment at Step S5. However, from the viewpoint of the throughput of the wafer treatment, the supply of water is preferably performed before the exposure processing at Step S4.

Note that the thermal treatment apparatus 40 in this embodiment has a configuration made by omitting the moisture supply unit from the thermal treatment apparatus 40 illustrated in FIG. 13, namely, a configuration made by omitting the water supply nozzle 500, the moving mechanism 501, the water supply pipe 502, the water supply source 503, and the valve 504.

Also this embodiment can produce the same effects as those in the above embodiments. More specifically, in place of the supply of the moisture-containing gas from the water supply nozzle 500 of the thermal treatment apparatus 40, water is supplied from the water supply nozzle 540 of the water coating apparatus 510 to the metal-containing resist film. This can accelerate the agglutination reaction of the metal-containing resist in the PEB treatment in the thermal treatment apparatus 40 to make the dimension of the resist pattern uniform. Further, execution of high rate exhaustion of the gas inside the treatment chamber 320 from the central portion in the PEB treatment enables collection of the metal-containing sublimate to suppress metallic contamination.

Note that in the case where the supply of moisture before the PEB treatment is performed outside the thermal treatment apparatus 40, the moisture supply unit is not limited to the water supply nozzle 540 in the water coating apparatus 510. For example, the moisture supply unit may be provided, for example, in the interface station 13 to supply the moisture-containing gas from the moisture supply unit, thereby increasing the humidity inside the interface station 13.

Note that although the case of using the metal-containing resist as the metal-containing material is described in the third embodiment, the third embodiment is also applicable to other metal-containing materials, for example, a metal hard mask material as in the first embodiment and the second embodiment.

<Fourth Embodiment>

Next, a fourth embodiment of the thermal treatment apparatus 40 will be described. The thermal treatment apparatus 40 in the fourth embodiment has a configuration of the heating unit 310 changed from that of the thermal treatment apparatus 40 in the first embodiment and has the same configuration regarding other than that.

Figure 15:
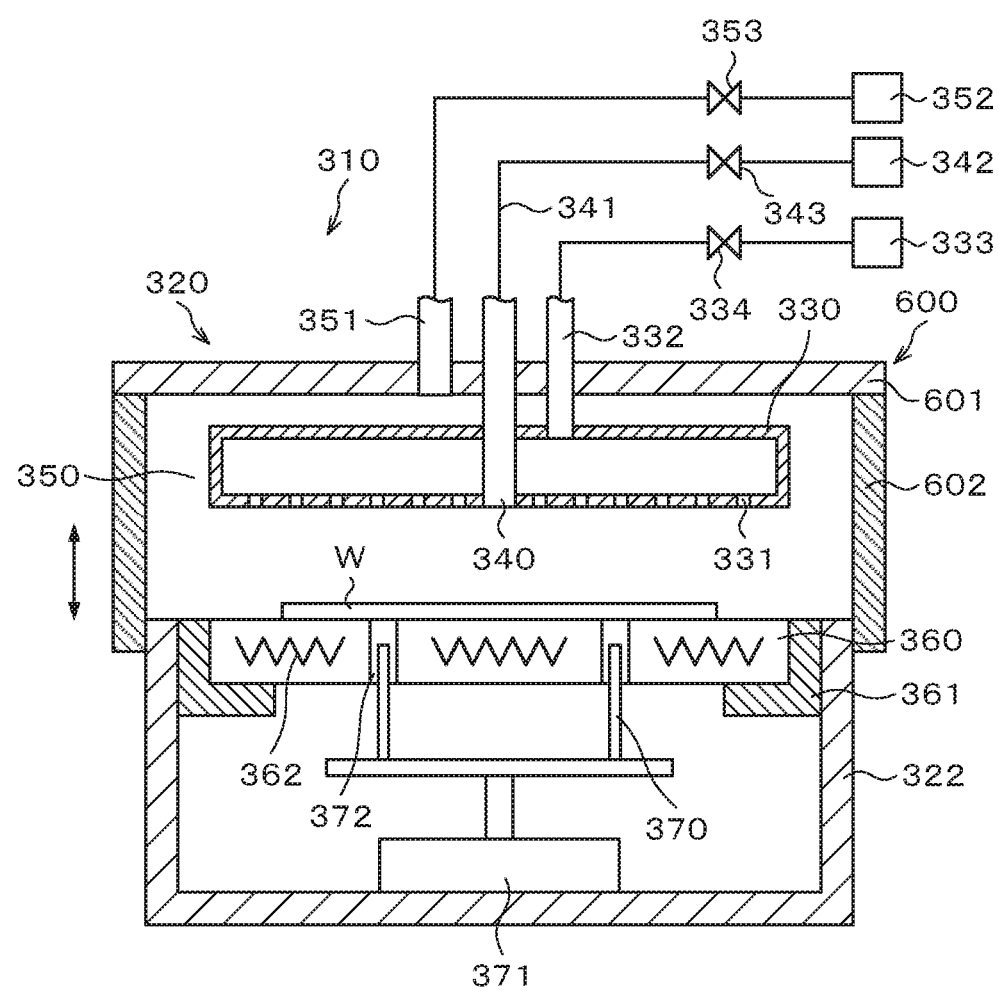
FIG. 15 is a longitudinal sectional view schematically illustrating the outline of a configuration of a heating unit according to a fourth embodiment.

First, the configuration of the heating unit 310 will be described. FIG. 15 is a longitudinal sectional view schematically illustrating the outline of a configuration of a heating unit 310 according to the fourth embodiment.

An upper chamber 600 of the heating unit 310 is provided in place of the upper chamber 321 in the first embodiment. The upper chamber 600 has an almost cylindrical shape with a lower face open as a whole. The upper chamber 600 has a top plate 601 and an opening and closing shutter 602 provided downward from the outer peripheral portion of the top plate 601. The top plate 601 is fixed, and the opening and closing shutter 602 is configured to freely rise and lower.

Then, the opening and closing shutter 602 and the lower chamber 322 are brought into contact with each other to seal the inside of the treatment chamber 320. More specifically, the upper chamber 321 itself is raised and lowered to open and close the upper chamber 321 in the first embodiment, whereas the opening and closing shutter 602 is opened and closed to open and close the treatment chamber 320 in the fourth embodiment.

Note that the other configuration of the heating unit 310 is the same as the configuration of the heating unit 310 in the first embodiment, and therefore description thereof is omitted.

Figure 16:
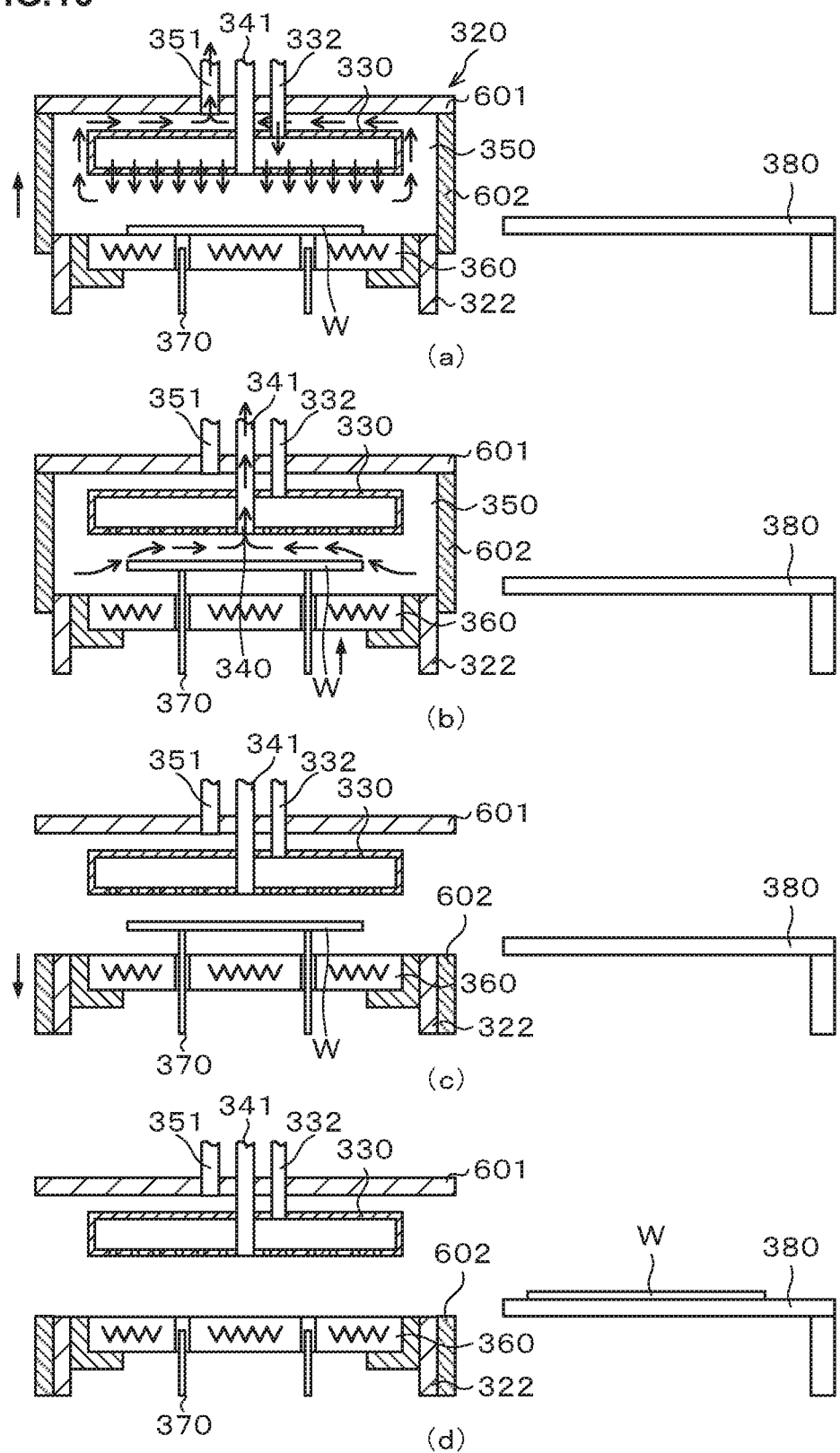
FIG. 16 is an explanatory view illustrating the operation of a thermal treatment apparatus according to the fourth embodiment, (a) illustrating a state where a moisture-containing gas is supplied while the wafer is being heated on a thermal treatment plate of a sealed treatment chamber, (b) illustrating a state where supply of the moisture-containing gas is stopped and an atmosphere in the treatment chamber is being exhausted, (c) illustrating a state where an opening and closing shutter is lowered to open the treatment chamber, and (d) illustrating a state where the wafer is delivered from raising and lowering pins to a temperature regulation plate.

Next, the PEB treatment performed using the thermal treatment apparatus 40 configured as described above will be described. FIG. 16 is an explanatory view illustrating the operation of the thermal treatment apparatus 40.

First, in the state where the opening and closing shutter 602 is raised to seal the inside of the treatment chamber 320 as illustrated in (a) of FIG. 16, the wafer W is mounted on the thermal treatment plate 360 and heated to a predetermined temperature. This step is almost the same as Step B1 in the first embodiment. More specifically, the moisture-containing gas having a moisture concentration adjusted, for example, to 43% to 60% is supplied from the shower head 330, for example, at a flow rate of 4 L/min to adjust the inside atmosphere of the treatment chamber 320, for example, to have a humidity of 43% to 60%. This accelerates the agglutination reaction of the metal-containing resist. Further, the gas inside the treatment chamber 320 is exhausted from the outer peripheral exhaust path 350 (outer peripheral portion of the treatment chamber 320) is exhausted at, for example, 4 L/min or more.

Thereafter, the wafer W is raised by the raising and lowering pins 370 to separate the wafer W from the thermal treatment plate 360 as illustrated in (b) of FIG. 16. In this state, the supply of the moisture-containing gas from the shower head 330 is stopped and the exhaustion of the gas inside the treatment chamber 320 from the outer peripheral exhaust path 350 is stopped. Then, the gas inside the treatment chamber 320 is exhausted from the central exhaust path 340 (central portion of the treatment chamber 320) at, for example, 20 L/min to 70 L/min. Since the wafer W is separated from the thermal treatment plate 360 in this event, the agglutination reaction of the metal-containing resist is stopped to suppress occurrence of the metal-containing sublimate from the metal-containing resist. Further, the wafer W is close to the central exhaust path 340, the metal-containing sublimate can be more efficiently collected. Note that this step is almost the same as Step B3 in the first embodiment, and performed, for example, 10 sec. to 15 sec.

Thereafter, the opening and closing shutter 602 is lowered as illustrated in (c) of FIG. 16 to open the treatment chamber 320. In this event, the occurrence of the metal-containing sublimate is suppressed and the metal-containing sublimate is appropriately collected as illustrated in (b) of FIG. 16, thus making it possible to prevent the metal-containing sublimate from leaking to the outside.

Then, the wafer W is delivered from the raising and lowering pins 370 to the temperature regulation plate 380 as illustrated in (d) of FIG. 16, and then, during the movement of the temperature regulation plate 380, the wafer W is regulated to a predetermined temperature. This step is almost the same as Step B4 in the first embodiment.

Also this embodiment can produce the same effects as those in the above embodiments. More specifically, the supply of the moisture-containing gas to the inside of the treatment chamber 320 can accelerate the agglutination reaction of the metal-containing resist to make the dimension of the resist pattern uniform. Further, execution of high rate exhaustion of the gas inside the treatment chamber 320 from the central portion enables collection of the metal-containing sublimate to suppress metallic contamination.

Note that although the case of using the metal-containing resist as the metal-containing material is described in the fourth embodiment, the fourth embodiment is also applicable to other metal-containing materials, for example, a metal hard mask material as in the first to third embodiments.

<Fifth Embodiment>

Although moisture is supplied to the metal-containing resist film as the metal-containing film before the PEB treatment or during the PEB treatment in the above first to fourth embodiments, positive supply of water may be omitted, for example, in the case where the metal-containing film is the metal hard mask because the metal hard mask is lower in sensitivity to moisture than is the metal-containing resist.

However, even in this case, it is necessary to control the gas currents in the thermal treatment so as to suppress the film quality unevenness of the metal hard mask being the cause of nonuniformity of the wet etching as described above. Hence, to prevent the outside air being a cause of disturbing the gas currents inside the treatment chamber 320 in the heating unit 310 of the thermal treatment apparatus 40, a gas current (a so-called air curtain) may be formed in the vertical direction and in a ring shape at the outer peripheral portion of the treatment chamber 320 (upper chamber 321).

The fifth embodiment of the thermal treatment apparatus 40 is configured to form the air curtain in the heating unit 310. The thermal treatment apparatus 40 in the fifth embodiment has a configuration of the heating unit 310 changed from that of the thermal treatment apparatus 40 in the first embodiment and has the same configuration regarding other than that.

Figure 17:
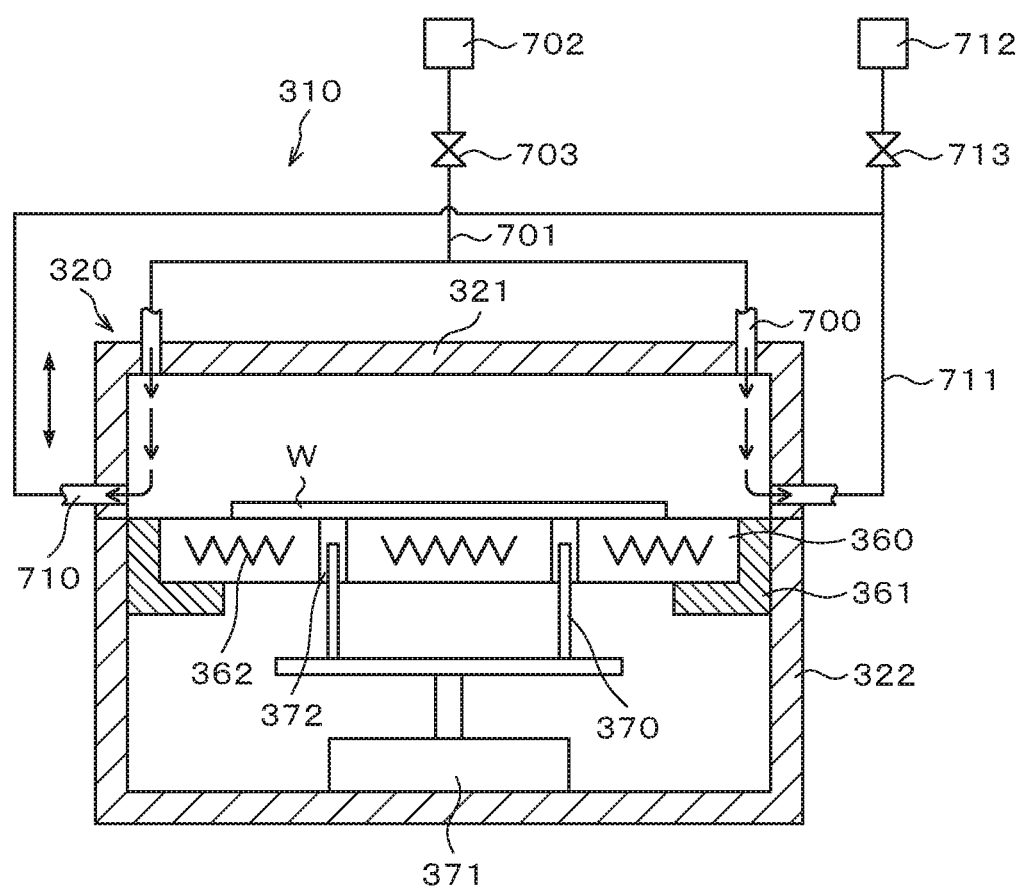
FIG. 17 is a longitudinal sectional view schematically illustrating the outline of a configuration of a heating unit according to a fifth embodiment.

First, the configuration of the heating unit 310 will be described. FIG. 17 is a longitudinal sectional view schematically illustrating the outline of a configuration of a heating unit 310 according to the fifth embodiment.

In the upper chamber 321 of the heating unit 310, the shower head 330, the gas supply pipe 332, the gas supply source 333, the valve 334, the central exhaust pipe 341, the exhaust apparatus 342, the valve 343, the outer peripheral exhaust path 350, the outer peripheral exhaust pipe 351, the exhaust apparatus 352, and the valve 353 in the first embodiment are omitted.

At an upper surface outer peripheral portion of the upper chamber 321, an air supply ring 700 is provided as an air supply unit that supplies air the outer peripheral portion of the treatment chamber 320. The air supply ring 700 is provided in a ring shape along the outer peripheral portion of the upper chamber 321. An air supply hole of the air supply ring 700 is also provided in a ring shape along the air supply ring 700.

To the air supply ring 700, an air supply pipe 701 is connected. Further, to the air supply pipe 701, an air supply source 702 is connected which supplies air to the air supply ring 700. The air supply pipe 701 is provided with a valve 703 that controls flow of air.

At a lower end portion of a side surface of the upper chamber 321, an exhaust ring 710 is provided as an air emission unit that emits the air supplied from the air supply ring 700. The exhaust ring 710 is provided in a ring shape along the outer peripheral portion of the upper chamber 321.

To the exhaust ring 710, an exhaust pipe 711 is connected. Further, to the exhaust pipe 711, an exhaust apparatus 712 such as a vacuum pump is connected. The exhaust pipe 711 is provided with a valve 713 that controls flow of exhausted air.

Note that the other configuration of the heating unit 310 is the same as the configuration of the heating unit 310 in the first embodiment, and therefore description thereof is omitted.

In the heating unit 310 configured as described above, in the state where the inside of the treatment chamber 320 is sealed, the wafer W is mounted on the thermal treatment plate 360 and heated to a predetermined temperature. In the thermal treatment, the air supplied from the air supply ring 700 is emitted from the exhaust ring 710, thereby forming a so-called air-curtain. This air-curtain suppresses flow of the outside air to the inside of the treatment chamber 320, thus making it possible to suppress occurrence of gas currents during the thermal treatment. Accordingly, it is possible to suppress the film quality unevenness of the metal hard mask and perform uniform etching of the metal hard mask.

Note that the air-curtain is formed by the gas current directed downward from above in the above embodiment, but may be formed by the gas current inversely directed upward from below.

Besides, the air-curtain at the outer peripheral portion of the treatment chamber 320 in the fifth embodiment may be applied to the above first to fourth embodiments. For example, the air-curtain may be formed at the outer peripheral portion of the treatment chamber 320 in the thermal treatment at Step A1 in the first embodiment to prevent the outside air from flowing to the inside of the treatment chamber 320. Alternatively, the air-curtain may be used in the high rate exhaustion of the gas inside the treatment chamber 320 at Step A3.

Preferred embodiments of the present invention have been described above with reference to the accompanying drawings, but the present invention is not limited to the embodiments. It should be understood that various changes and modifications are readily apparent to those skilled in the art within the scope of the spirit as set forth in claims, and those should also be covered by the technical scope of the present invention.

What is claimed is:

1. A thermal treatment apparatus that performs a thermal treatment on a metal-containing film formed on a substrate, the thermal treatment apparatus comprising:
   a treatment chamber that houses the substrate;
   a thermal treatment plate that is provided inside the treatment chamber and mounts the substrate thereon;
   a moisture supply unit that supplies moisture to the metal-containing film;
   a central exhaust unit that exhausts gas inside the treatment chamber from a central portion of the treatment chamber;
   an outer peripheral exhaust unit that exhausts the gas inside the treatment chamber from an outer peripheral portion of the treatment chamber; and
   a control unit that controls operations of the treatment chamber, the thermal treatment plate, the moisture supply unit, the central exhaust unit, and the outer peripheral exhaust unit,
   wherein the moisture supply unit supplies moisture-containing gas to an inside of the treatment chamber, and
   wherein the control unit is configured to control the operations of the thermal treatment plate, the moisture supply unit, the central exhaust unit, and the outer peripheral exhaust unit so as to perform:
      a first step of supplying the moisture-containing gas from the moisture supply unit to the inside of the treatment chamber and exhausting the gas inside the treatment chamber from the outer peripheral portion of the treatment chamber by the outer peripheral exhaust unit at a first exhaust rate, in a state where the substrate is mounted on the thermal treatment plate; and
      thereafter, a second step of stopping supply of the moisture-containing gas from the moisture supply unit, and exhausting the gas inside the treatment chamber from the central portion of the treatment chamber by the central exhaust unit at a second exhaust rate higher than the first exhaust rate.

2. The thermal treatment apparatus according to claim 1, wherein the moisture supply unit is a shower head that is provided inside the treatment chamber and at a position facing the thermal treatment plate, and
wherein the shower head has a plurality of gas supply holes formed in a lower surface thereof.

3. The thermal treatment apparatus according to claim 1, wherein the treatment chamber has an upper chamber that freely rises and lowers and a lower chamber that unites with the upper chamber to be able to seal an inside thereof, and
wherein the control unit is configured to control, at the second step, the treatment chamber and the central exhaust unit so as to raise the upper chamber to make outside air flow from the outer peripheral portion to the inside of the treatment chamber, and exhaust the gas inside the treatment chamber from the central portion of the treatment chamber by the central exhaust unit.

4. The thermal treatment apparatus according to claim 1, wherein the control unit is configured to control, after the first step and before the second step, the moisture supply unit and the outer peripheral exhaust unit so as to stop supply of the moisture-containing gas from the moisture supply unit, and exhaust the gas inside the treatment chamber from the outer peripheral portion of the treatment chamber at the first exhaust rate by the outer peripheral exhaust unit.

5. The thermal treatment apparatus according to claim 1, further comprising:
   a raising and lowering unit that raises and lowers the substrate,
   wherein the control unit is configured to control, after the second step, the raising and lowering unit, the moisture supply unit and the central exhaust unit so as to raise the substrate from the thermal treatment plate by the raising and lowering unit, stop supply of the moisture-containing gas from the moisture supply unit, and exhaust the gas inside the treatment chamber from the central portion of the treatment chamber at the second exhaust rate by the central exhaust unit.

6. A thermal treatment apparatus that performs a thermal treatment on a metal-containing film formed on a substrate, the thermal treatment apparatus comprising:
   a treatment chamber that houses the substrate;
   a thermal treatment plate that is provided inside the treatment chamber and mounts the substrate thereon;
   a moisture supply unit that supplies moisture to the metal-containing film; and
   a central exhaust unit that exhausts gas inside the treatment chamber from a central portion of the treatment chamber;
   wherein the moisture supply unit is provided in a ring shape at an outer peripheral portion of the treatment chamber and supplies the moisture-containing gas to the inside of the treatment chamber, and
   wherein the central exhaust unit is provided at an upper surface central portion of the treatment chamber.

7. The thermal treatment apparatus according to claim 6, wherein the moisture supply unit is formed with a plurality of gas supply holes at regular intervals on a circumference of the moisture supply unit.

8. The thermal treatment apparatus according to claim 7, further comprising:
   a gas flow unit provided in a ring shape at the outer peripheral portion of the treatment chamber and on an inner side of the moisture supply unit,
   wherein the gas flow unit is formed with a plurality of gas flow holes at regular intervals on a circumference of the gas flow unit.

9. A thermal treatment apparatus that performs a thermal treatment on a metal-containing film formed on a substrate, the thermal treatment apparatus comprising:
   a treatment chamber that houses the substrate;
   a thermal treatment plate that is provided inside the treatment chamber and mounts the substrate thereon;
   a moisture supply unit that supplies moisture to the metal-containing film;
   a central exhaust unit that exhausts gas inside the treatment chamber from a central portion of the treatment chamber;
   an opening and closing shutter that is provided at an outer peripheral portion of the treatment chamber and opens and closes the treatment chamber;
   a raising and lowering unit that raises and lowers the substrate in the treatment chamber;
   an outer peripheral exhaust unit that exhausts the gas inside the treatment chamber from the outer peripheral portion of the treatment chamber; and
   a control unit that controls the opening and closing shutter, the thermal treatment plate, the raising and lowering unit, the moisture supply unit, the central exhaust unit, and the outer peripheral exhaust unit,
   wherein the moisture supply unit supplies moisture-containing gas to the inside of the treatment chamber, and
   wherein the control unit is configured to control the opening and closing shutter, the thermal treatment plate, the raising and lowering unit, the moisture supply unit, the central exhaust unit, and the outer peripheral exhaust unit so as to perform:
      a first step of supplying the moisture-containing gas from the moisture supply unit to the inside of the treatment chamber and exhausting the gas inside the treatment chamber from the outer peripheral portion of the treatment chamber by the outer peripheral exhaust unit, in a state where the treatment chamber is closed by the opening and closing shutter and the substrate is mounted on the thermal treatment plate;
      thereafter, a second step of raising the substrate from the thermal treatment plate by the raising and lowering unit, stopping supply of the moisture-containing gas from the moisture supply unit, and exhausting the gas inside the treatment chamber from the central portion of the treatment chamber by the central exhaust unit; and
      thereafter, a third step of opening the treatment chamber by the opening and closing shutter.

10. A thermal treatment apparatus that performs a thermal treatment on a metal-containing film formed on a substrate, the thermal treatment apparatus comprising:
   a treatment chamber that houses the substrate;
   a thermal treatment plate that is provided inside the treatment chamber and mounts the substrate thereon;
   a moisture supply unit that supplies moisture to the metal-containing film;
   a central exhaust unit that exhausts gas inside the treatment chamber from a central portion of the treatment chamber;
   an air supply unit that is provided in a ring shape at one end portion in a vertical direction of an outer peripheral portion of the treatment chamber and supplies air to the outer peripheral portion of the treatment chamber, and
   an air emission unit that is provided in a ring shape at another end portion in the vertical direction of the outer peripheral portion of the treatment chamber and emits the air supplied from the air supply unit.

* * * * *